«12» United States Patent
Kamiya et al.

«11» Patent Number: 6,080,624
«45» Date of Patent: Jun. 27, 2000

[54] NONVOLATILE SEMICONDUCTOR MEMORY AND METHOD FOR MANUFACTURING THE SAME

[75] Inventors: Eiji Kamiya, Kawasaki; Seiichi Aritome, Yokohama, both of Japan

[73] Assignee: Kabushiki Kaisha Toshiba, Kawasaki, Japan

[21] Appl. No.: 09/104,622

[22] Filed: Jun. 25, 1998

[30] Foreign Application Priority Data

Jun. 27, 1997 [JP] Japan ................................ 9-172450

[51] Int. Cl.⁷ ................... H01L 21/336; H01L 21/3205; H01L 21/4763
[52] U.S. Cl. ............................... 438/257; 438/585
[58] Field of Search ........................ 438/257, 586, 438/231, 279, 128; 365/189.11

[56] References Cited

U.S. PATENT DOCUMENTS

| | | | |
|---|---|---|---|
| 4,495,693 | 1/1985 | Iwahashi et al. | 29/571 |
| 4,818,714 | 4/1989 | Haskell | 437/44 |
| 4,992,389 | 2/1991 | Ogura et al. | 437/41 |
| 5,019,527 | 5/1991 | Ohshima et al. | 437/43 |
| 5,227,319 | 7/1993 | Ogura et al. | 437/41 |
| 5,270,240 | 12/1993 | Lee | 437/52 |

*Primary Examiner*—John F. Niebling
*Assistant Examiner*—Walter L. Lindsay, Jr.
*Attorney, Agent, or Firm*—Hogan & Hartson LLP

[57] ABSTRACT

The present invention is directed to a flash EEPROM in which a plurality of resist patterns are arranged like an island such that only an interlayer insulation film formed on a field oxide film is left in order to insulate drain diffusion layers of cell transistors in the row direction from each other when contacts of a memory cell group are subjected to PEP. Using the island-like resist patterns as masks, contact holes communicating with both the drain diffusion layers and source diffusion layers are made. Since, therefore, drain and source contact holes are arranged in matrix, the PEP margin can greatly be increased, thereby making it possible to prevent the problems of forming no contact holes and causing a short circuit between the gate and contact from arising.

15 Claims, 18 Drawing Sheets

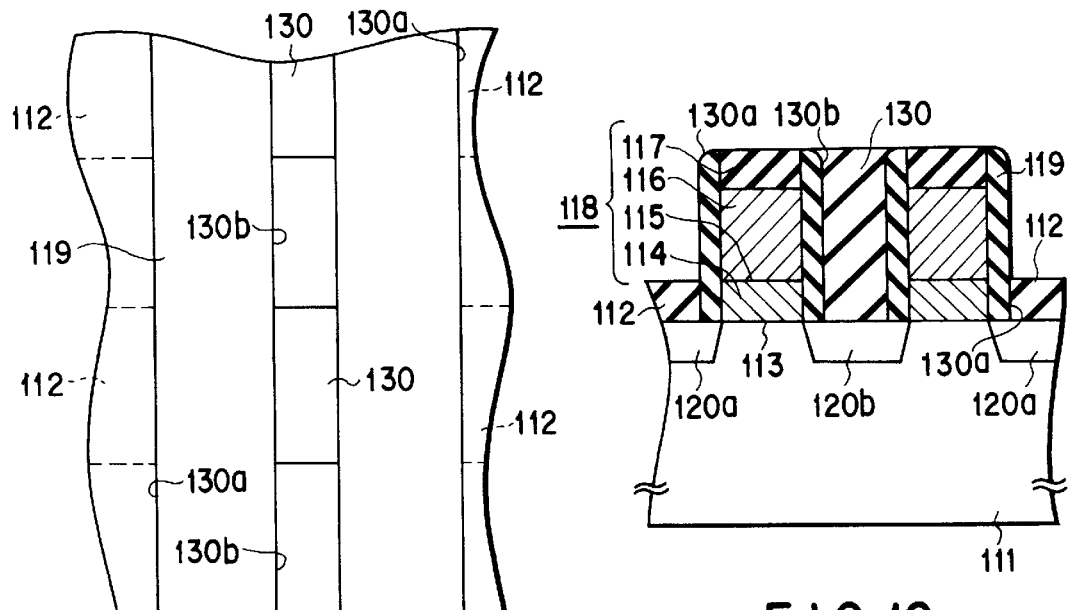
FIG. 9A
FIG. 10
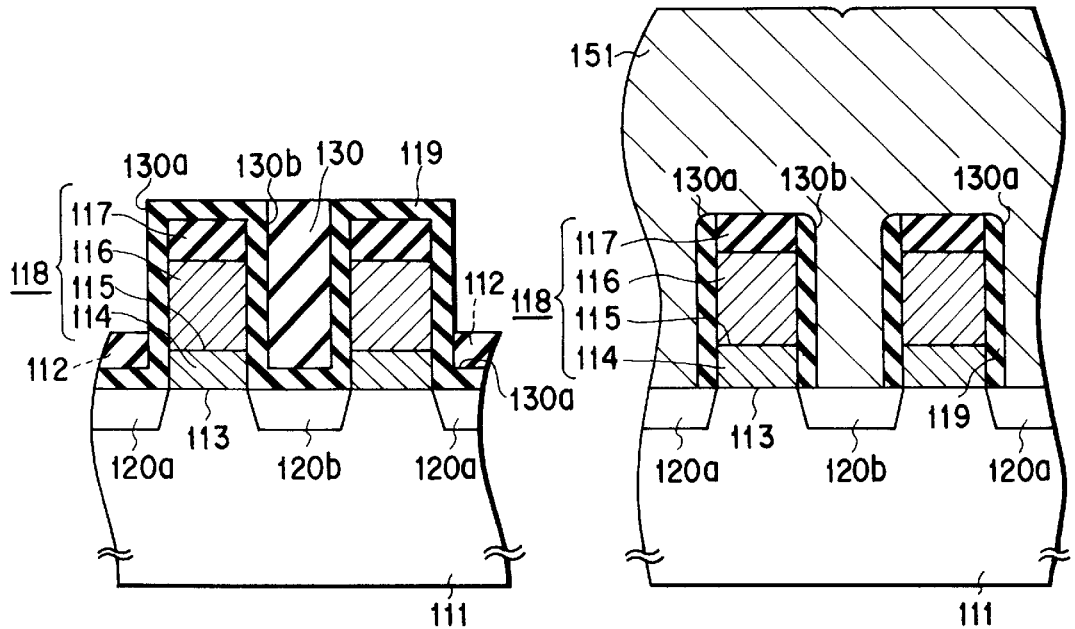
FIG. 9B
FIG. 11

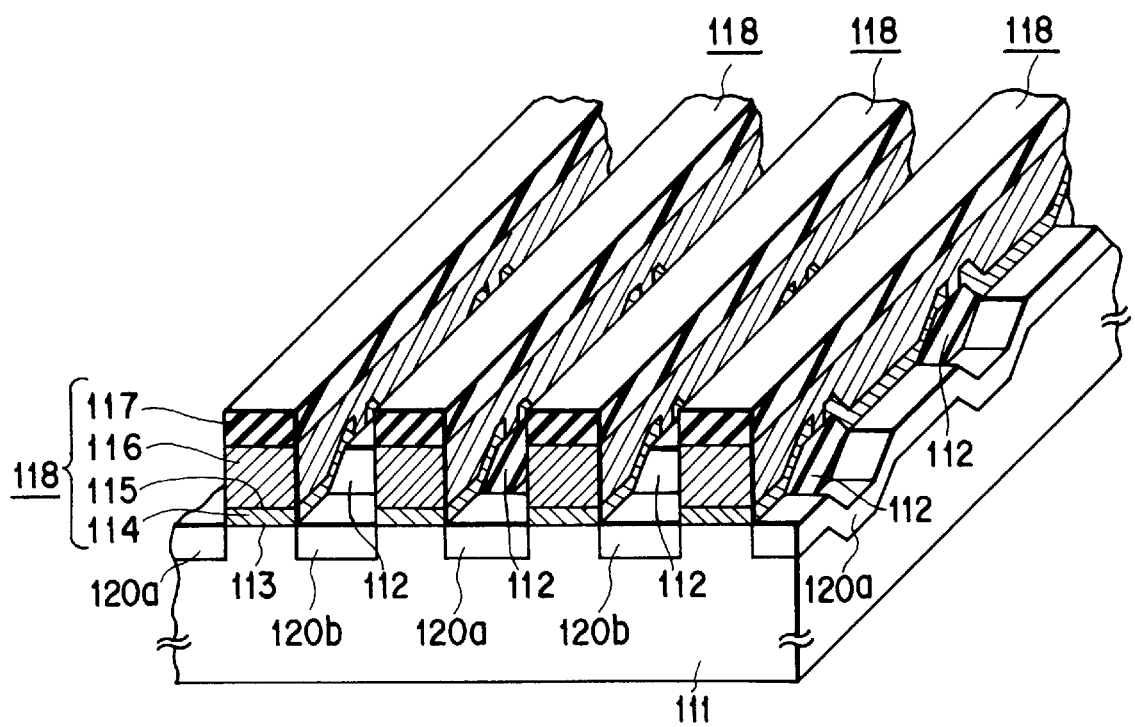
F I G. 17
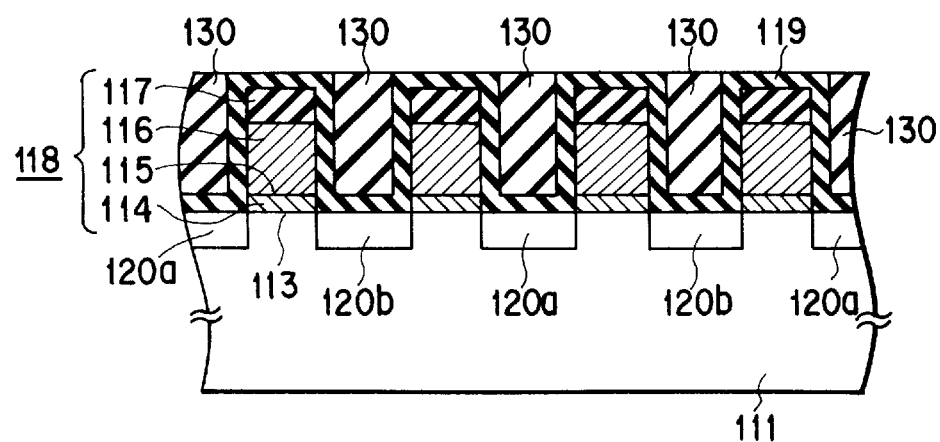
F I G. 18

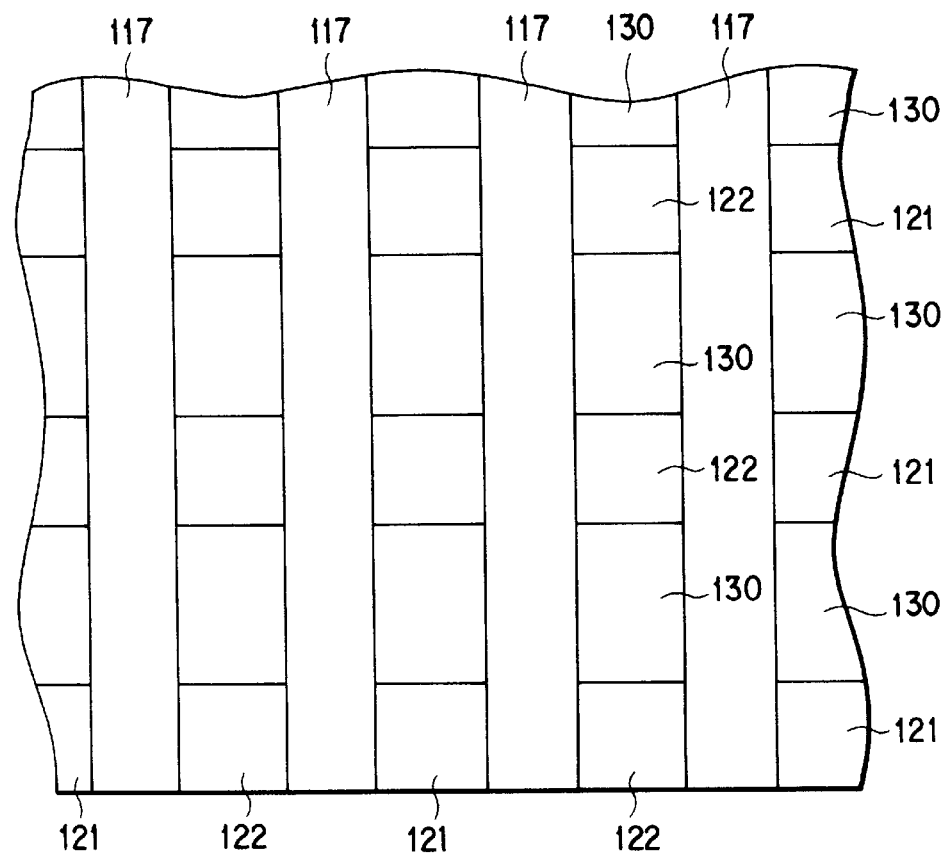
F I G. 21A
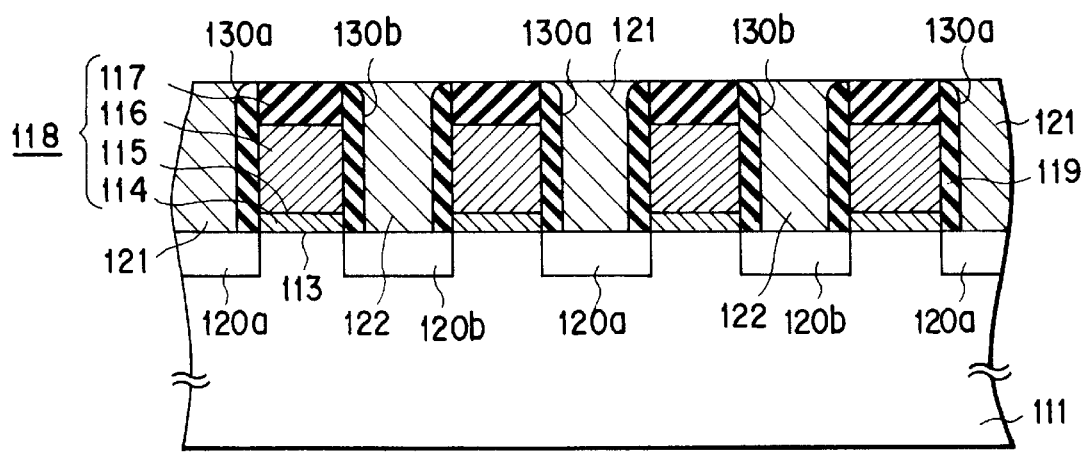
F I G. 21B

NONVOLATILE SEMICONDUCTOR MEMORY AND METHOD FOR MANUFACTURING THE SAME

BACKGROUND OF THE INVENTION

The present invention relates to a nonvolatile semiconductor memory and a method for manufacturing the same and, more specifically, to a flash EEPROM (Electrically Erasable Programmable Read-Only Memory) capable of erasing and writing data together by electrical signals.

Recently a demand for increasing the speed and capacity (degree of integration) of a semiconductor memory has become stronger and stronger, as has a demand for miniaturizing the devices. These demands are true of a nonvolatile semiconductor memory such as an EPROM (Erasable PROM) and an EEPROM using a two-layered gate of a stacked structure.

Miniaturization of memory cells is essential to an increase in capacity of a semiconductor memory. As one method for achieving this, the SAC (Self-Align Contact) technique has conventionally been known and, using this technique, a contact hole is decreased in diameter.

FIGS. 1A and 1B illustrate a process of manufacturing a prior art nonvolatile semiconductor memory in which a contact hole can be formed finely using the SAC technique or a PEP (Photo Engraving Process) of a contact. For example, in a memory cell transistor region, an element isolating field oxide film (not shown) is formed on a P-type semiconductor substrate 301, and then a gate insulation film 302, a floating gate electrode 303, an ONO (oxide/nitride/oxide) film 304, a control gate electrode 305, and an SiN film 306 serving as a cap material are sequentially stacked one on another thereby to form a two-layered gate section. Then, ions are implanted to form both a source diffusion layer 307a serving as a source region and a drain diffusion layer 307b serving as a drain region on the surface of the substrate 301. After that, an SiN film 308 is formed on the entire surface of the resultant structure, and an interlayer insulation film 309 is deposited on the entire surface of the SiN film 308. The surface of the insulation film 309 is flattened by the CMP (Chemical Mechanical Polishing) technique. In order to reduce the amount of polishing, that portion of the interlayer insulation film 309, which is separated at a distance (margin D) from the upper surface of the SiN film 308 on the two-layered gate section, is flattened.

After that, a contact is formed through the PEP using the SAC technique and, in other words, a resist pattern 310 is formed on the interlayer insulation film 309. In accordance with the resist pattern 310, the interlayer insulation film 309 is etched by anisotropic etching such as RIE (Reactive Ion Etching) in self-alignment with the SiN film 308. Thus, contact holes 311 are formed selectively in the interlayer insulation film 309. These holes are finely formed at the same interval as that between the two-layered gate sections.

However, an opening type pattern having an opening portion 310a formed in which position the contact holes 311 are made, is generally used as the resist pattern 310 for the PEP of contacts. The margin of the PEP is therefore reduced in accordance with miniaturization of the contact holes 311. The thickness (H) of a portion of the interlayer insulation film 309, which is removed by RIE, is equal to the total of the height of the two-layered gate section and the margin (D) thereabove, as shown in FIG. 2. The ratio of the depth of each of the contact holes 311 (thickness H of the interlayer insulation film 309) to the width (A) thereof, or a so-called aspect ratio (H/A) is increased too much.

As the miniaturization of contacts is promoted, it becomes more difficult to sufficiently make the contact holes 311, keeping the selective ratio of the interlayer insulation film 309 to the SiN film 308 high. Consequently, the problems that no contact hole is formed and a short circuit is caused between the gate and contact, are easy to arise.

BRIEF SUMMARY OF THE INVENTION

It is accordingly an object of the present invention to provide a nonvolatile semiconductor memory which prevents the problems of forming no contact holes and causing a short circuit between the gate and contact from arising and thus easily maintains high reliability, and a method for manufacturing the same.

To attain the above object, according to a first aspect of the present invention, there is provided a nonvolatile semiconductor memory comprising: a semiconductor substrate of a first conductivity type; at least two gate electrodes formed above the semiconductor substrate and arranged at predetermined intervals substantially in parallel with each other; a first semiconductor region of a second conductivity type provided in a surface area of the semiconductor substrate between the gate electrodes; a second semiconductor region of the second conductivity type formed in the surface area of the semiconductor substrate and located opposite to the first semiconductor region with the gate electrodes therebetween; and conductive plugs arranged in matrix and communicating with one of the first semiconductor region and the second semiconductor region.

According to a second aspect of the present invention, there is provided a method for manufacturing a nonvolatile semiconductor memory comprising: a first step of forming at least two gate electrodes above a semiconductor substrate of a first conductivity type so as to be arranged at predetermined intervals substantially in parallel with each other; a second step of diffusing impurities of a second conductivity type to form a first semiconductor region in a surface area of the semiconductor substrate between the gate electrodes and a second semiconductor region in the surface area of the semiconductor substrate such that each of the gate electrodes is interposed between the first and second semiconductor regions; a third step of forming a first insulation film on an entire surface of a resultant structure; a fourth step of depositing a second insulation film whose etching rate differs from that of the first insulation film; a fifth step of flattening a surface of the second insulation film using the first insulation film as a stopper; a sixth step of forming a resist pattern having a predetermined shape on the second insulation film to selectively remove the second insulation film located above the first semiconductor region and the second semiconductor region; a seventh step of removing the first insulation film remaining on the first and second semiconductor regions to expose surfaces of the first and second semiconductor regions and then depositing a conductive material on an entire surface of a resultant structure; and an eighth step of flattening a surface of the conductive material so as to be substantially flush with an upper surface of each of the gate electrodes to form conductive plugs communicating with the first and second semiconductor regions.

According to a third aspect of the present invention, there is provided a method for manufacturing a nonvolatile semiconductor memory comprising: a first step of selectively forming element isolation regions on a main surface area of a semiconductor substrate having a first conductivity type; a second step of forming at least two gate electrodes above the semiconductor substrate in a direction substantially perpendicular to the element isolation regions so as to be arranged at predetermined intervals substantially in parallel with each other; a third step of alternately removing the element isolation regions formed between the at least two gate electrodes; a fourth step of diffusing impurities of a second conductivity type to selectively form a first semiconductor region in a surface area of the semiconductor substrate between the at least two gate electrodes and continuously form a second semiconductor region in the surface area of the semiconductor substrate such that each of the at least two gate electrodes is interposed between the first and second semiconductor regions; a fifth step of forming a first insulation film on an entire surface of a resultant structure; a sixth step of depositing a second insulation film whose etching rate differs from that of the first insulation film; a seventh step of flattening a surface of the second insulation film using the first insulation film as a stopper; an eighth step of forming a resist pattern having a predetermined shape on the second insulation film to selectively remove the second insulation film located above the first semiconductor region and the second semiconductor region; a ninth step of removing the first insulation film remaining on the first and second semiconductor regions to expose surfaces of the first and second semiconductor regions and then depositing a conductive material on an entire surface of a resultant structure; and a tenth step of flattening a surface of the conductive material so as to be substantially flush with an upper surface of each of the at least two gate electrodes to form conductive plugs communicating with the first and second semiconductor regions.

According to a fourth aspect of the present invention, there is provided a method for manufacturing a nonvolatile semiconductor memory comprising: a first step of selectively forming element isolation regions on a main surface area of a semiconductor substrate having a first conductivity type; a second step of forming a plurality of gate electrodes above the semiconductor substrate in a direction substantially perpendicular to the element isolation regions so as to be arranged at predetermined intervals substantially in parallel with each other; a third step of diffusing impurities of a second conductivity type to form semiconductor regions in a surface area of the semiconductor substrate at one side of each of the gate electrodes and at another side thereof; a fourth step of forming a first insulation film on an entire surface of a resultant structure; a fifth step of depositing a second insulation film whose etching rate differs from that of the first insulation film; a sixth step of flattening a surface of the second insulation film using the first insulation film as a stopper; a seventh step of forming a resist pattern like a stripe in a direction substantially perpendicular to the at least two gate electrodes and selectively removing the second insulation film above the semiconductor regions; an eighth step of removing the first insulation film remaining on the semiconductor regions to expose surfaces of the semiconductor regions and then depositing a conductive material on an entire surface of a resultant structure; and a ninth step of flattening a surface of the conductive material so as to be substantially flush with an upper surface of each of the at least two gate electrodes to form conductive plugs communicating with the semiconductor regions.

According to a nonvolatile semiconductor memory having the above constitution and a method for manufacturing the same, the PEP margin can be increased and the aspect ratio can be decreased when a contact hole is made. Thus, the contact hole can sufficiently be formed keeping the selective ratio of the second insulation film to the first insulation film high.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

FIG. 9A is a plan view illustrating the memory cell group to explain a method for manufacturing the same;

FIG. 9B is a front view illustrating the same memory cell group as shown in FIG. 9A;

FIG. 10 is a front view illustrating the memory cell group to explain a method for manufacturing the same;

FIG. 11 is a front view illustrating the memory cell group to explain a method for manufacturing the same;

FIG. 17 is a perspective view illustrating the memory cell group to explain a method for manufacturing the same;

FIG. 18 is a front view illustrating the memory cell group to explain a method for manufacturing the same;

FIG. 21A is a plan view illustrating the memory cell group to explain a method for manufacturing the same;

FIG. 21B is a front view illustrating the same memory cell group as shown in FIG. 21A;

DETAILED DESCRIPTION OF THE INVENTION

Embodiments of the present invention will now be described with reference to the accompanying drawings.
(First Embodiment)

Figure 3:
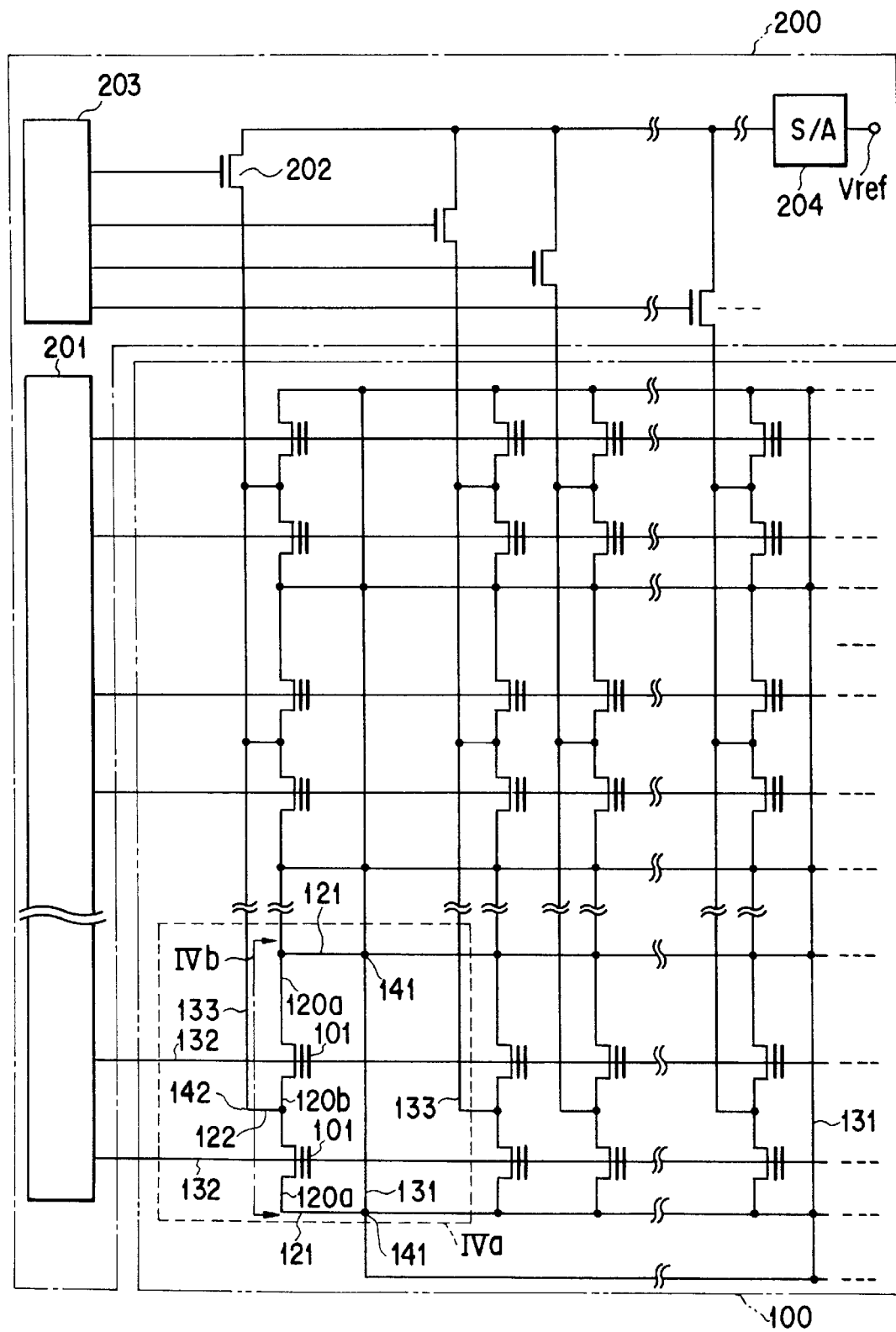
FIG. 3 is a circuit diagram of a NOR type flash EEPROM according to a first embodiment of the present invention.

FIG. 3 illustrates the circuit arrangement of a NOR type flash EEPROM having a two-layered gate structure (stacked structure) according to a first embodiment of the present invention. The flash EEPROM includes a memory cell group (memory cell transistor region) 100 and its peripheral section 200. The memory cell group 100 is constituted of a plurality of cell transistors 101 arranged in matrix or in row and column directions. The cell transistors 101 are connected to source lines 131, which are formed in the column direction, through contact portions 121 in such a manner that adjacent cell transistors 101 share an N-type (second conductivity type) source diffusion layer 120a in the row direction. The source lines 131 are connected every 64 cell transistor 101 and thus reduced in number. In the cell transistors 101 arranged in the row direction, control gate electrodes 116 are connected to each other to form word lines 132. The word lines 132 are connected to a column decoder 201 in the peripheral section 200. In the cell transistors 101 in the column direction, N-type drain diffusion layers 120b are connected to bit lines 133 through contact portions 122. The bit lines 133 are connected to a row decoder 203 through peripheral transistors 202 in the peripheral section 200.

The peripheral section 200 includes a voltage terminal Vref connected to a peripheral transistor 202 via a sense amplifier (S/A) 204 as well as the column decoder 201 and row decoder 203.

In the NOR type flash EEPROM having the above constitution, data is read out by applying a voltage of 5V or 0V to the word lines 132, applying a voltage of 0V to the source lines 131, and applying a voltage of 1V to the bit lines 133 from the voltage terminal Vref through the peripheral transistor 202 and sense amplifier 204, while data is written by applying a voltage of 10V or 0V, a voltage of 0V, and a voltage of 10V to the word lines 132, the source lines 131, and the bit lines 133, respectively. Furthermore, data is electrically erased together by applying a voltage of −5V and a voltage of 5V to the word lines 132 and source lines 131, respectively.

Figure 4:
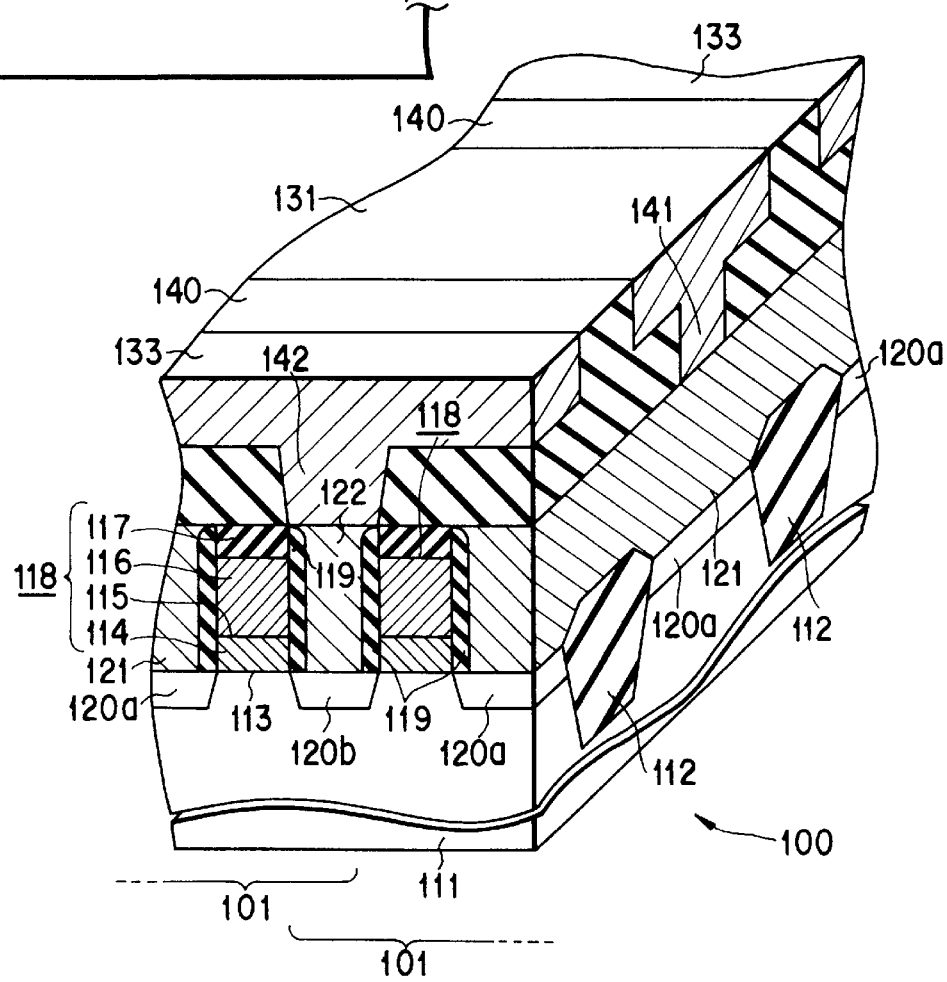
FIG. 4 is a perspective view illustrating the structure of a memory cell group of the NOR type flash EEPROM.

FIG. 4 illustrates the structure of the memory cell group 100 in the foregoing NOR type flash EEPROM. The memory cell group 100 shown in FIG. 4 corresponds to the range surrounded with a broken line $IV_a$ in FIG. 3. The section of the memory cell group 100 corresponds to the range indicated by alternate long and short dashed lines $IV_b$ in FIG. 3. More specifically, in the memory cell group 100, element isolating field oxide films 112 are formed on the major surface of a P-type (first conductivity type) semiconductor substrate 111 in its column direction. A plurality of two-layered gate (gate electrode) sections 118, which are arranged almost at regular intervals in parallel with each other, are each formed on the P-type semiconductor substrate 111 with a gate insulation film 113 interposed therebetween. In each of the two-layered gate sections 118, a floating gate electrode 114, an ONO (oxide/nitride/oxide) film 115 serving as an inter-gate insulation film, a control gate electrode 116 serving as a word line 132, and an SiN film 117 serving as a cap material are stacked on the gate insulation film 113 in this order in the row direction. An SiN film (first insulation film) 119 serving as a sidewall, is formed on both sides of each of the two-layered gate sections 118. An N-type drain diffusion layer (first semiconductor region of the second conductivity type) 120b serving as a drain region is formed in the surface area of the P-type semiconductor substrate 111 between the two-layered gate sections 118, while an N-type source diffusion layer (second semiconductor region of the second conductivity type) 120a serving as a source region is formed in the surface area of the substrate 111 such that the two-layered gate section 118 is interposed between the layers 120a and 120b. Thus, adjacent cells are common to the source and drain diffusion layers 120a and 120b, and the plural cell transistors 101 are arranged in matrix.

In each of the cell transistors 101 arranged in the row direction, the source diffusion layer 120a is connected to the source line 131, which is formed in the column direction, through the contact portion 121. More specifically, the source line 131 is connected to the contact portion 121 through a source line contact 141 which is formed integrally with the source line 131 by the damascene technique. On the other hand, in each of the cell transistors 101 arranged in the column direction, the drain diffusion layer 120b is connected to the bit line 133 through the contact portion 122. More specifically, the bit line 133 is connected to the contact portion 122 through a bit line contact 142 which is formed integrally with the bit line 133 by the damascene technique.

The whole surface of the resultant structure is coated with a passivation film (not shown) to constitute the memory cell group 100 of the NOR type flash EEPROM.

Figure 5:
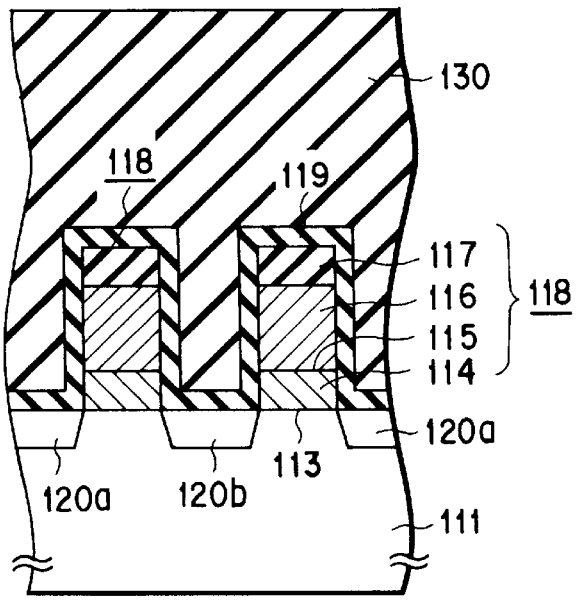
FIG. 5 is a front view illustrating the memory cell group to explain a method for manufacturing the same.

A method for manufacturing the foregoing memory cell group 100 will now be described with reference to FIGS. 5 to 15. First, an element isolating field oxide film 112 is formed on the major surface area of a P-type semiconductor substrate 111 and then, as shown in FIG. 5, two-layered gate sections 118 of cell transistors 101 are each formed on a gate insulation film 113 and each has a floating gate electrode 114, an ONO film 115, a control gate electrode 116 and an SiN film 117 serving as a cap. By ion implantation of N-type impurities, source and drain diffusion layers 120a and 120b of the cell transistors 101 are formed in the surface area of the substrate 111 except where the field oxide film 112 is formed. After that, an insulation film is deposited on the entire surface of the resultant structure to form an SiN film 119, and then an interlayer insulation film (second insulation film) 130 is formed on the entire surface of the film 119.

Figure 6:
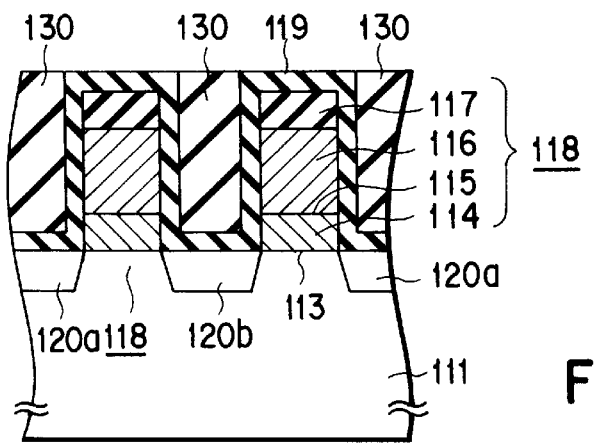
FIG. 6 is a front view illustrating the memory cell group to explain a method for manufacturing the same.

Subsequently, as illustrated in FIG. 6, the surface of the interlayer insulation film 130 is flattened using a processing technique such as CMP and, in this case, the SiN film 119 is employed as a stopper.

Figure 7:
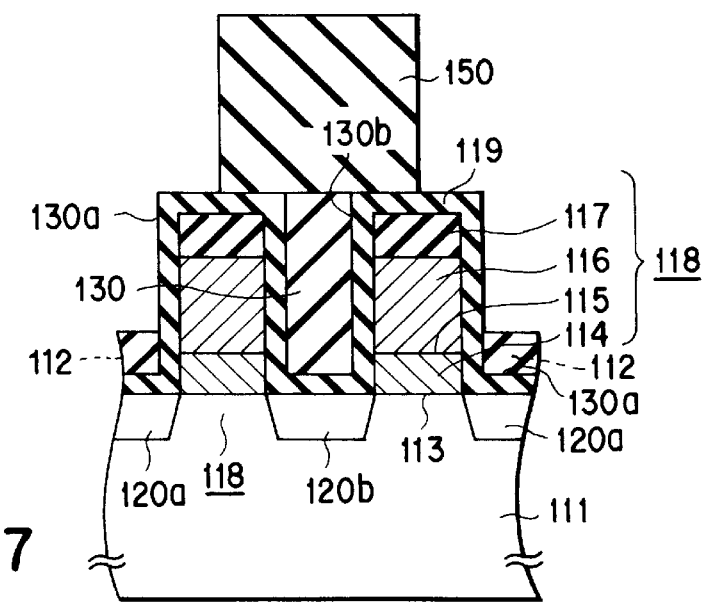
FIG. 7 is a front view illustrating the memory cell group to explain a method for manufacturing the same.

As shown in FIG. 7, an island-like resist pattern 150 is formed by PEP and, using this pattern as a mask, the interlayer insulation film 130 is etched in a self-alignment fashion by RIE. Thus, contact holes 130b are partly made to communicate with drain diffusion layers 120b of the cell transistors 101 arranged in the column direction, as are slit-like contact holes 130a to communicate with source diffusion layers 120a of the cell transistors arranged in the row direction.

Figure 8A:
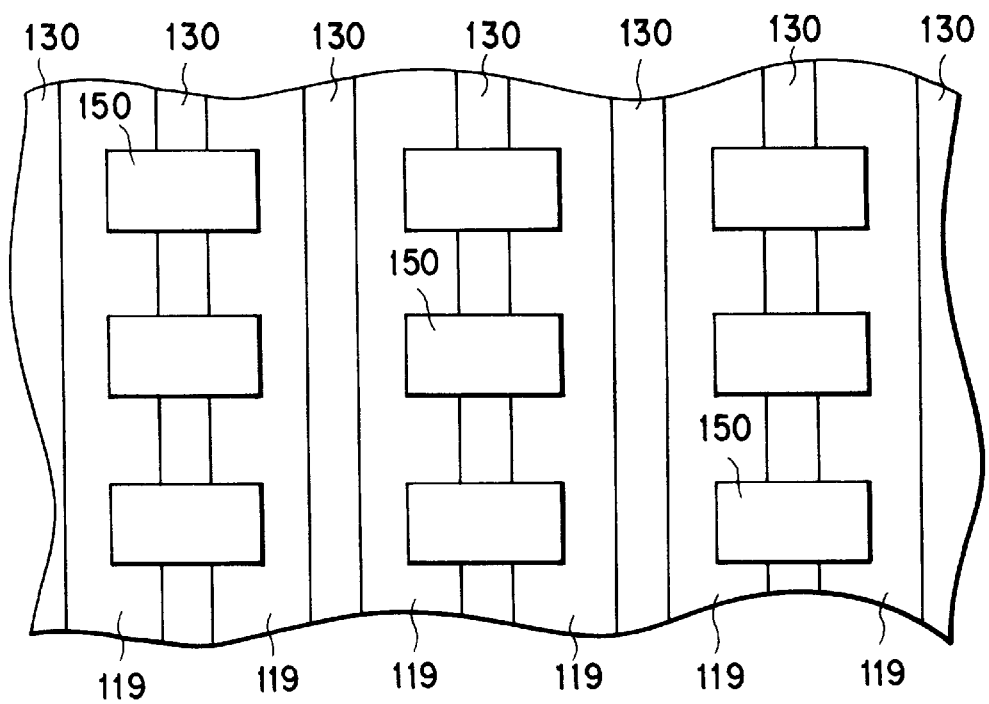
FIG. 8A is a plan view illustrating an example of a resist pattern in manufacturing the memory cell group.
Figure 8B:
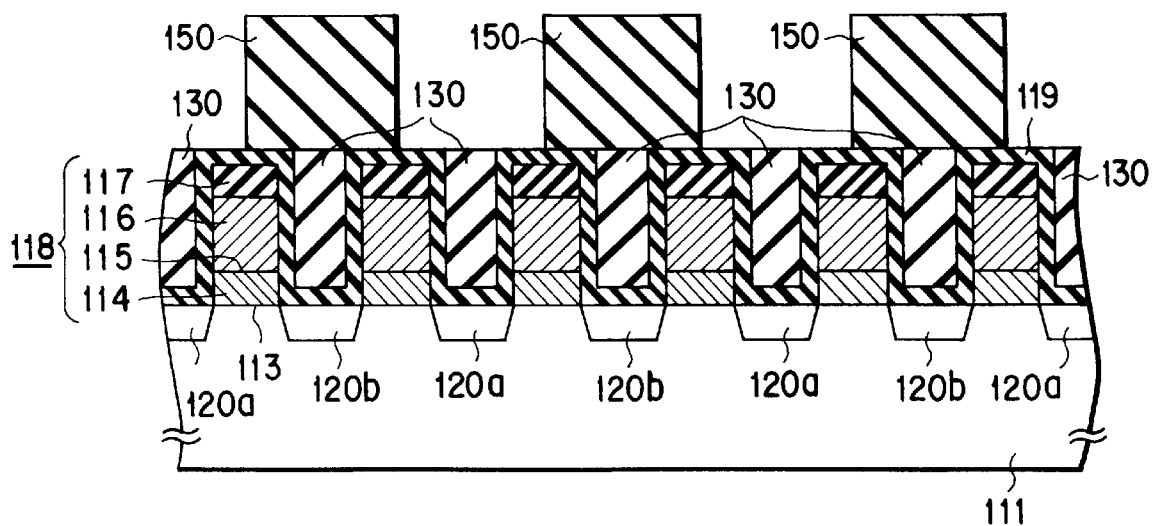
FIG. 8B is a front view illustrating the same example as that of FIG. 8A.

FIGS. 8A and 8B illustrate an example of the arrangement of resist patterns 150 used for PEP of contacts in manufacturing the above NOR type flash EEPROM (memory cell group 100). The resist patterns 150 are arranged like an island such that only the interlayer insulation film 130 is left on the field oxide film 112 in order to insulate the drain diffusion layers 120b of the cell transistors in the row direction from each other. Thus, the interlayer insulation film 130 is etched in a self-alignment fashion so as to open the upper portions of the drain diffusion layers 120b of the cell transistors arranged in the column direction and also to open the upper portions of the source diffusion layers 120a including the interlayer insulation film 130 on the field oxide film 112 in order to insulate the source diffusion layers 120a of the cell transistors 101 arranged in the row direction.

Figure 1A:
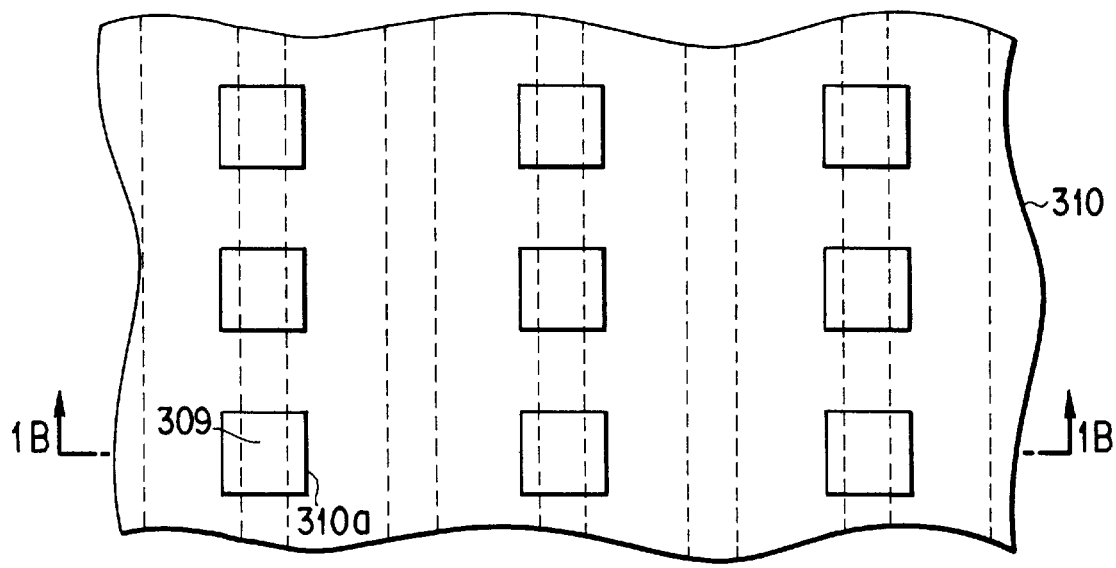
FIG. 1A is plan view illustrating a prior art nonvolatile semiconductor memory in order to explain the main step (PEP of contacts) of a process for manufacturing the same.
Figure 1B:
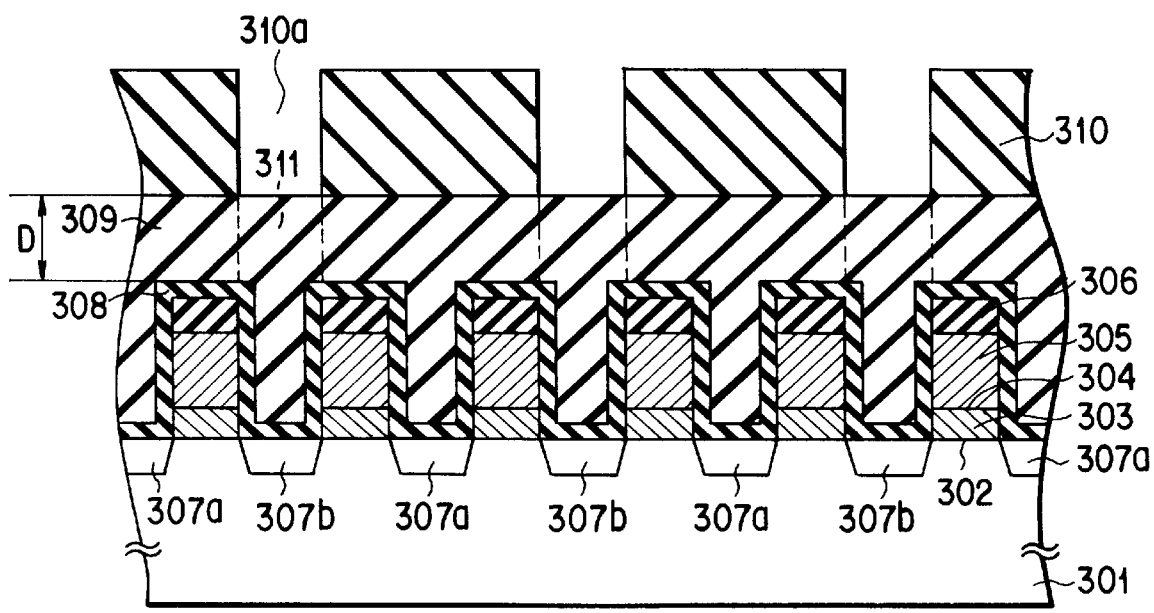
FIG. 1B is a cross-sectional view taken along line 1B—1B of FIG. 1A.

The PEP margin required when only the contact holes are formed in a self-alignment fashion, can be increased more greatly than that required when the prior art opening type pattern is used (see FIGS. 1A and 1B). Since, moreover, the surface of the interlayer insulation film 130 is flattened in advance using the SiN film 119 as a stopper, the thickness of part of the interlayer insulation film to be removed can be set substantially equal to the height of each of the two-layered gate sections 118 and the aspect ratio can be decreased accordingly. Consequently, even when the memory cells are miniaturized by miniaturizing the contacts in order to increase the capacity of a semiconductor memory, the contact holes 130a and 130b can be formed sufficiently, keeping the selective ratio of the interlayer insulation film 130 to the SiN film 119 high. The problems that no contact hole is formed and a short circuit is caused between the gate and contact, can thus be prevented from occurring, thereby easily increasing in reliability.

After the PEP of contacts is completed as described above, the resist patterns 150 used for forming the contact holes 130a and 130b are eliminated as illustrated in FIGS. 9A and 9B.

Subsequently, as shown in FIG. 10, the SiN film 119, which is exposed from the bottoms of the contact holes 130a and 130b and the surfaces of the two-layered gate sections 118, is etched by anisotropic etching such as RIE, with the result that a sidewall of the SiN film 119 is formed on each side of each of the two-layered gate sections 118. Thus, part of the surface of the remaining interlayer insulation film 130 is removed, and the contact holes 130b, which communicate with the drain diffusion layers 120b of the cell transistors arranged in the row direction, are completely made, as are the slit-like contact holes 130a communicating with the source diffusion layers 120a of the cell transistors 101 in the row direction.

Thereafter, as shown in FIG. 11, a tungsten film (conductive material) 151 is deposited on the entire surface of the resultant structure by CVD or the like to completely fill the contact holes 130a and 130b.

Figure 12:
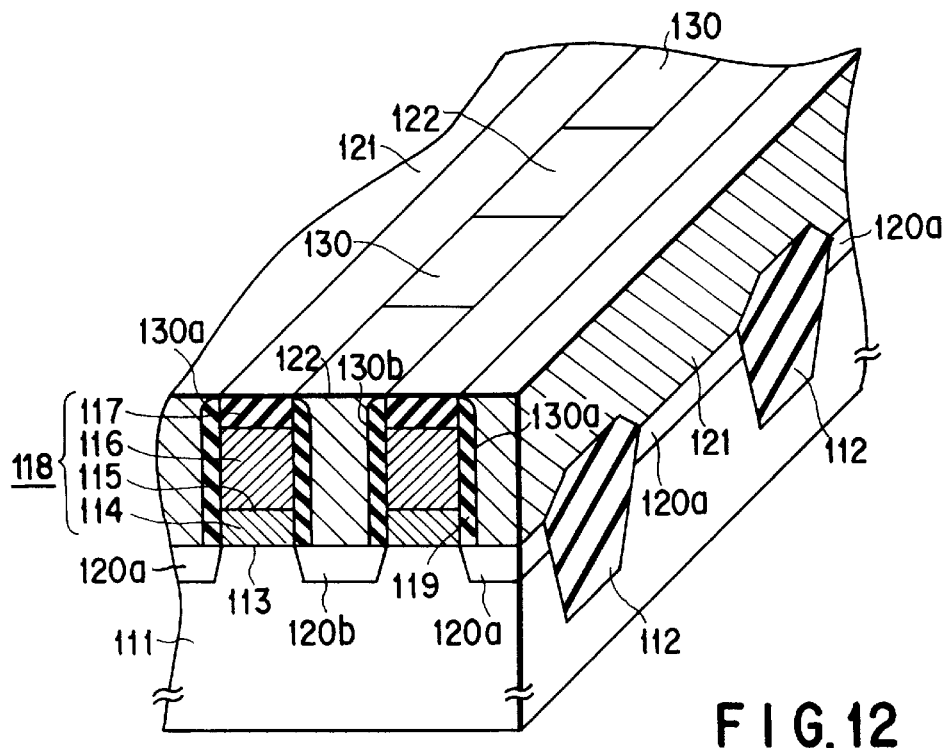
FIG. 12 is a perspective view illustrating the memory cell group to explain a method for manufacturing the same.

Referring to FIG. 12, the tungsten film 151 is etched by the processing technique such as CMP until the interlayer insulation film 130 is exposed, using the SiN film 117, which is formed on each of the two-layered gate sections 118 and serves as a cap, as a stopper, and its surface is flattened. Thus, the contact holes 130a are filled with the tungsten film 151 to form contact portions 121 communicating with the source diffusion layers 120a of the cell transistors 101 arranged in the column direction. At the same time, the contact holes 130b are filled with the tungsten film 151 to form contact portions 122 communicating with the drain diffusion layers 120b of the cell transistors 101 arranged in the row direction.

Figure 13A:
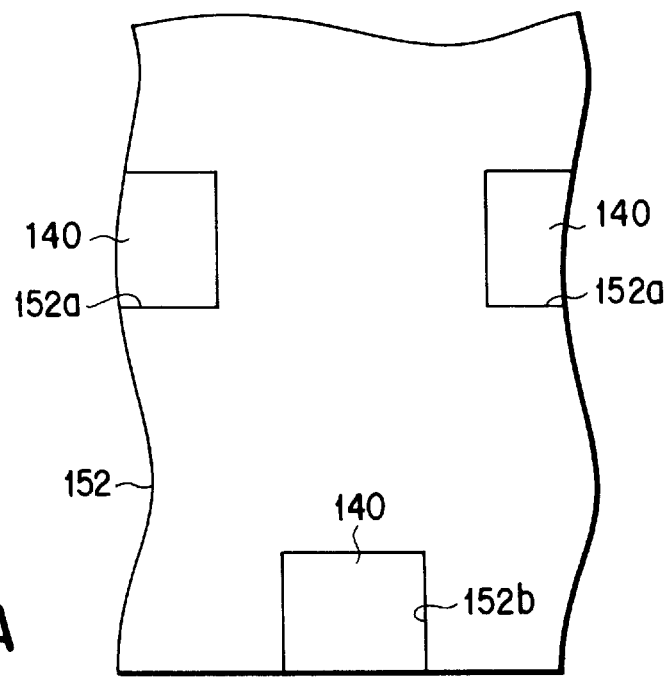
FIG. 13A is a plan view illustrating the memory cell group to explain a method for manufacturing the same.
Figure 13B:
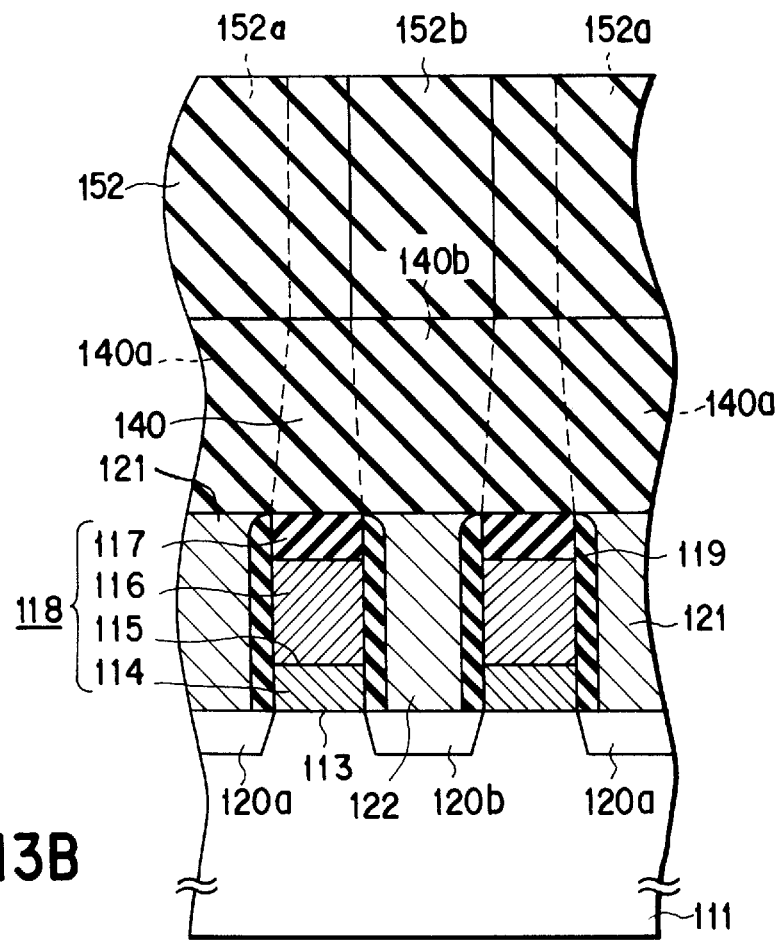
FIG. 13B is a front view illustrating the same memory cell group as shown in FIG. 13A.

After that, as shown in FIGS. 13A and 13B, an interlayer insulation film 140 is deposited on the whole surface of the resultant structure and then a resist pattern 152 is formed thereon by PEP. The resist pattern 152 has openings 152a for forming contact holes communicating with the contact portions 121 and opening 152b for forming contact holes communicating with the contact portions 122. Using the resist pattern 152 as a mask, the interlayer insulation film 140 is etched by RIE. Thus, contact holes 140a partly communicating with the contact portions 121 and contact holes 140b communicating with the contact portions 122 are made in order to form source line contacts 141 and bit line contacts 142.

Figure 14:
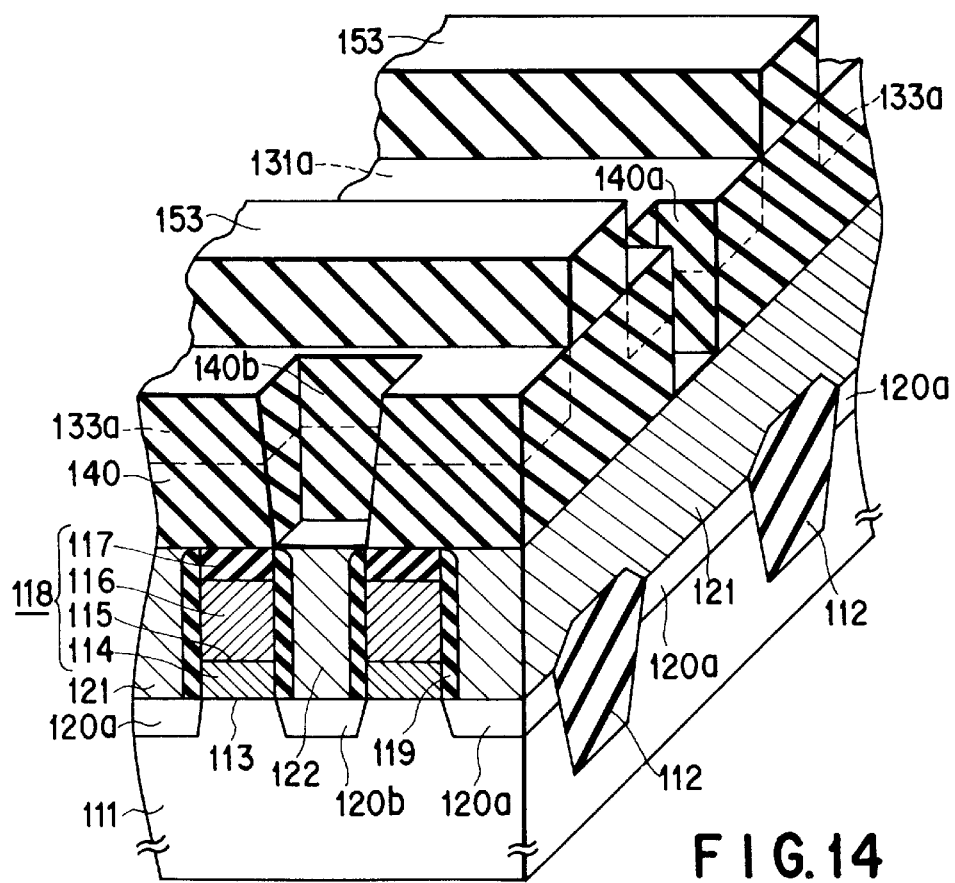
FIG. 14 is a perspective view illustrating the memory cell group to explain a method for manufacturing the same.

Subsequently, as illustrated in FIG. 14, the resist pattern 152 is removed and then another resist pattern 153 is formed to form source lines 131 and bit lines 133. Using the resist pattern 153 as a mask, part of the interlayer insulation film 140 is etched by RIE. Thus, a trench 131a (indicated by the broken line) for the first wiring layer, which communicates with the contact hole 140a, and another trench 133a (indicated by the broken line) for the first wiring layer, which communicates with the contact hole 140b, are formed.

Figure 15:
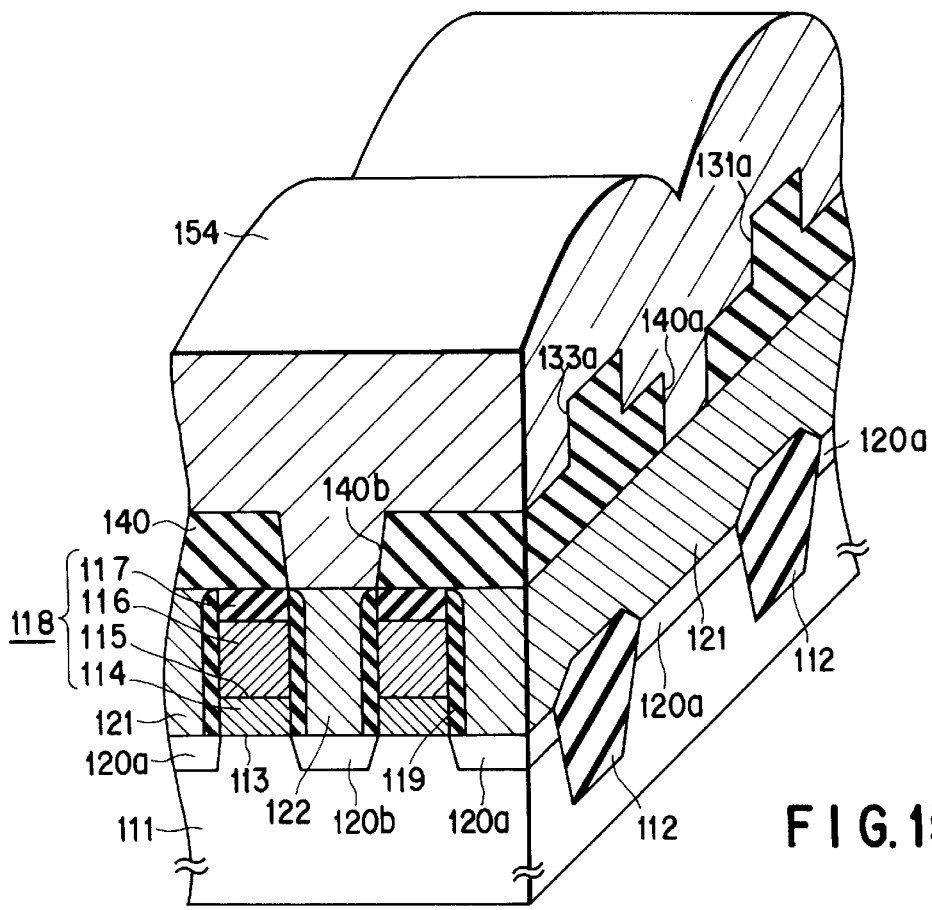
FIG. 15 is a perspective view illustrating the memory cell group to explain a method for manufacturing the same.

As shown in FIG. 15, after the resist pattern 153 is removed, a tungsten film 154 is deposited on the entire surface of the resultant structure using CVD or the like to completely fill the contact holes 140a and 140b and the trenches 131a and 133a. Then, the surface of the tungsten film 154 is etched and flattened by the processing technique such as CMP, resulting in the NOR type flash EEPROM with the memory cell group having the structure shown in FIG. 4.

More specifically, the tungsten film 154 remains only in the contact hole 140a and trench 131a to form the source line 131 and the source line contact 141 for connecting the source line 131 to the contact section 121 integrally with each other as a damascene structure. Similarly, the tungsten film 154 remains only in the contact hole 140a and trench 133a to form the bit line 133 and the bit line contact 142 for connecting the bit line 133 to the contact section 122 integrally with each other as a damascene structure. After that, the passivation process is executed to complete the NOR type flash EEPROM with the memory cell group 100 having the above structure.

Figure 2:
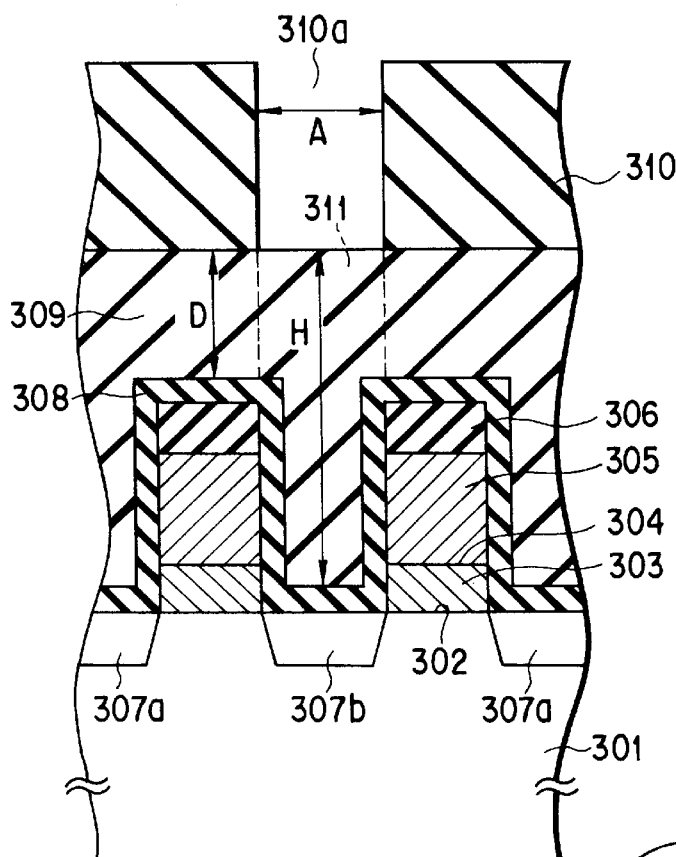
FIG. 2 is a cross-sectional view illustrating the prior art nonvolatile semiconductor memory in order to explain the drawback thereof.

As described above, the PEP margin can be increased and the aspect ratio can be decreased when a contact hole is made in the manufacture of the memory cell group. More specifically, a resist pattern is formed like an island, and the contact holes communicating with the drain diffusion layers of the cell transistors in the column direction are formed, as are the slit-like contact holes communicating with the source diffusion layers of the cell transistors in the row direction. Therefore, the PEP margin can be increased more greatly than that required when the prior art opening type pattern for opening only the contact portions in a self-alignment fashion is used. Moreover, the interlayer insulation film is flattened using the SiN film on the two-layered gate section as a stopper to make the surface of the interlayer insulation film substantially flush with the two-layered gate section, and the PEP is executed for the contacts. For this reason, there is no margin above the two-layered gate section (see FIG. 2) and the aspect ratio can be decreased accordingly. Consequently, the contact holes can sufficiently be made, keeping the selective ratio of the interlayer insulation film to the SiN film high, thereby reliably preventing the problems of forming no contact holes and causing a short circuit between the gate and contact from arising.

According to the first embodiment of the present invention, an island-like resist pattern is used to execute the PEP of contacts. However, the present invention is not limited to this. For example, a striped resist pattern can be used.

(Second Embodiment)

FIGS. 16 to 24 illustrate a nonvolatile semiconductor memory according to a second embodiment of the present invention, and a method for manufacturing a memory cell group of a NOR type flash EEPROM as the nonvolatile semiconductor memory in which a contact is subjected to the PEP using a striped resist pattern. First, as illustrated in FIG. 17, an element isolating field oxide film 112 is formed on the major surface area of a P-type semiconductor substrate 111. After that, a gate insulation film 113 is formed on the substrate 111, and a two-layered gate section 118 of a cell transistor 101 is formed on the film 113. The two-layered gate section 118 includes a floating gate electrode 114, an ONO film 115, a control gate electrode 116, and an SiN film 117 for a cap. That portion of the field oxide film 112 where an N-type source diffusion layer 120a is formed, is selectively removed to expose the surface of the P-type semiconductor substrate 111. After that, N-type impurities are ion-implanted to form source and drain diffusion layers 120a and 120b of the cell transistor and, in this case, each of the source diffusion layers 120a is shared with adjacent cell transistors 101 arranged in the row direction.

Subsequently, as illustrated in FIG. 18, an insulation film is deposited on the entire surface of the resultant structure to form an SiN film 119 and then an interlayer insulation film (second insulation film) 130 is deposited thereon. The surface of the interlayer insulation film 130 is flattened by the processing technique such as CMP, using the SiN film 119 on the two-layered gate section 118 as a stopper.

Figure 19A:
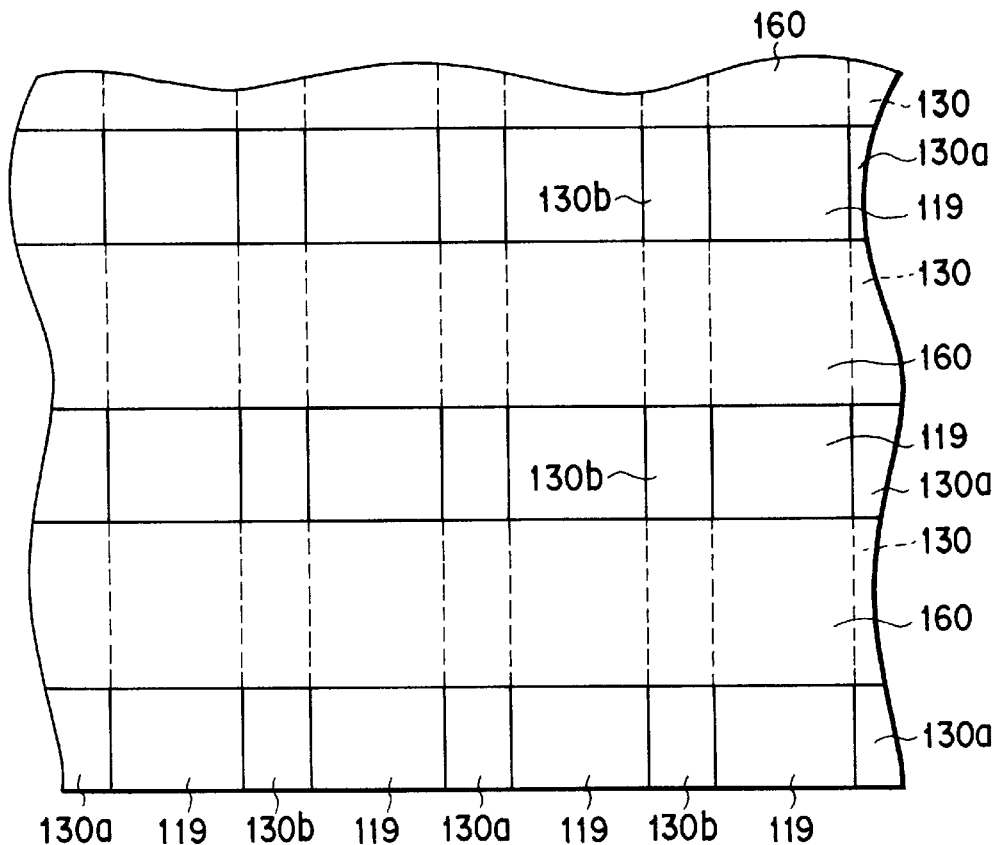
FIG. 19A is a plan view illustrating the memory cell group to explain a method for manufacturing the same.
Figure 19B:
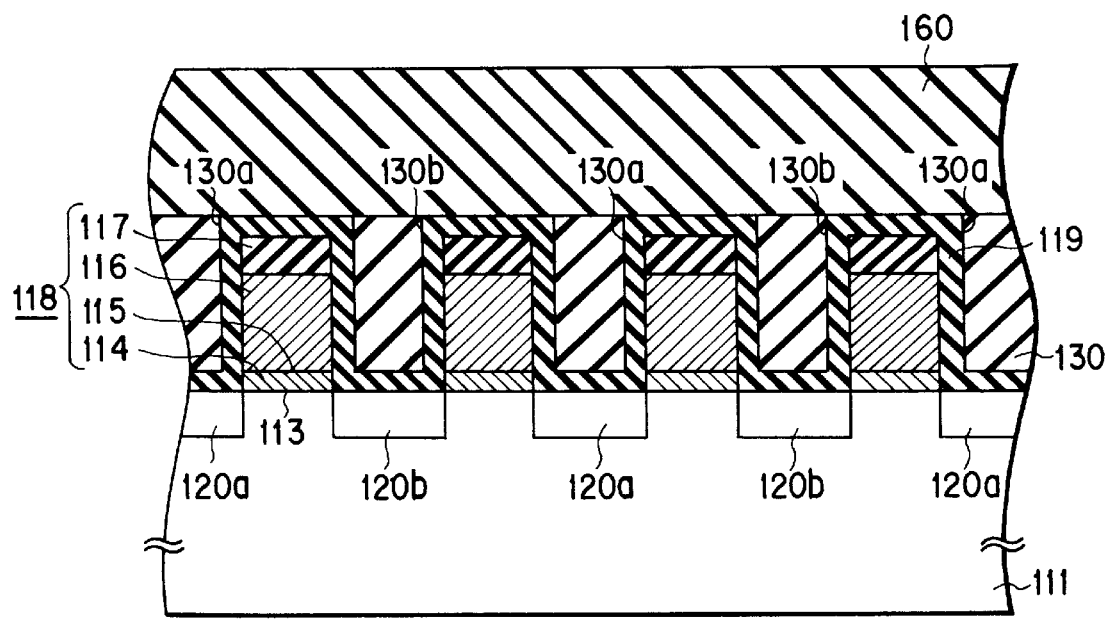
FIG. 19B is a front view illustrating the same memory cell group as shown in FIG. 19A.

Referring to FIGS. 19A and 19B, a striped resist pattern 160 is formed by PEP and, using it as a mask, the interlayer insulation film 130 is etched by RIE. Thus, contact holes 130b, which communicate with the drain diffusion layers 120b of the cell transistors arranged in the column direction, are partly made, as are contact holes 130a which communicate with the source diffusion layers 120a shared with the cell transistors 101 arranged in the row direction.

Figure 20:
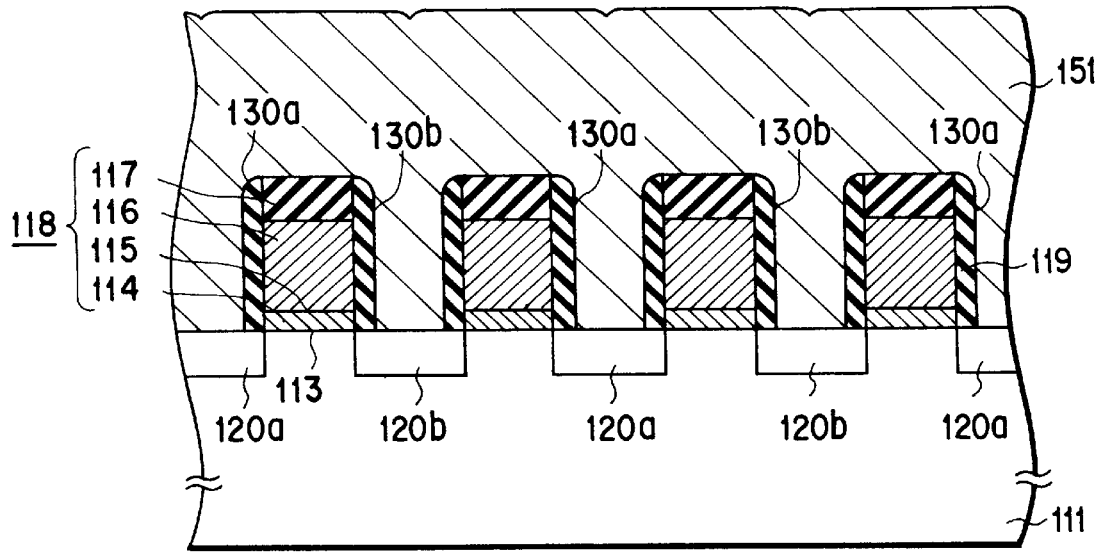
FIG. 20 is a front view illustrating the memory cell group to explain a method for manufacturing the same.

After the PEP of contacts is completed, as shown in FIG. 20, the resist pattern 160 used for making the contact holes 130a and 130b, is eliminated and then the SiN film 119, which is exposed from the bottoms of the contact holes 130a and 130b and the surfaces of the two-layered gate sections 118, is etched by anisotropic etching such as RIE, with the result that a sidewall of the SiN film 119 is formed on each side of each of the two-layered gate sections 118. Thus, part of the surface of the remaining interlayer insulation film 130 is removed, and the contact holes 130b, which communicate with the drain diffusion layers 120b of the cell transistors arranged in the column direction, are completely made, as are the contact holes 130a communicating with the source diffusion layers 120a of the cell transistors 101 arranged in the row direction.

A tungsten film (conductive material) 151 is deposited on the entire surface of the resultant structure by CVD or the like to completely fill the contact holes 130a and 130b. Using the SiN film 117, formed on the two-layered gate sections 118, as a stopper, the tungsten film 151 is etched by the processing technique such as CMP until the interlayer insulation film 130 is exposed, and the surface of the film 151 is flattened. Thus, the contact holes 130a are filled with the tungsten film 151 to form contact portions 121 communicating with the source diffusion layers 120a of the cell transistors 101 arranged in the row direction. At the same time, the contact holes 130b are filled with the tungsten film 151 to form contact portions 122 communicating with the drain diffusion layers 120b of the cell transistors 101 arranged in the column direction. In this case, as illustrated in FIGS. 21A and 21B, the contact portions 121 and 122 are arranged in matrix in each of the cell transistors arranged in the row and column directions.

Figure 22:
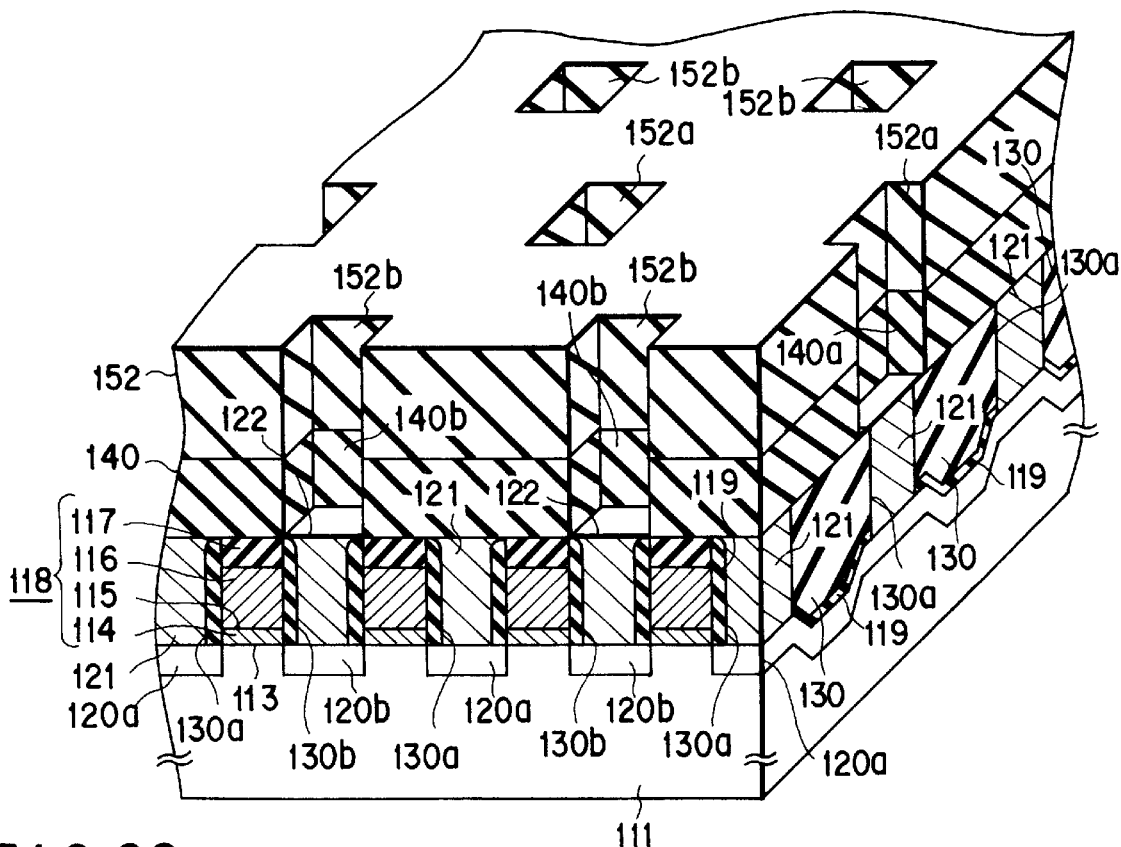
FIG. 22 is a perspective view illustrating the memory cell group to explain a method for manufacturing the same.

After that, as shown in FIG. 22, an interlayer insulation film 140 is deposited on the whole surface of the resultant structure and then a resist pattern 152 is formed thereon by PEP. The resist pattern 152 has openings 152a for forming contact holes communicating with the contact portions 121 and opening 152b for forming contact holes communicating with the contact portions 122. Using the resist pattern 152 as a mask, the interlayer insulation film 140 is etched by RIE. Thus, contact holes 140a communicating with one of the contact portions 121 and contact holes 140b communicating with the contact portions 122 are made in order to form source line contacts 141 and bit line contacts 142.

Figure 23A:
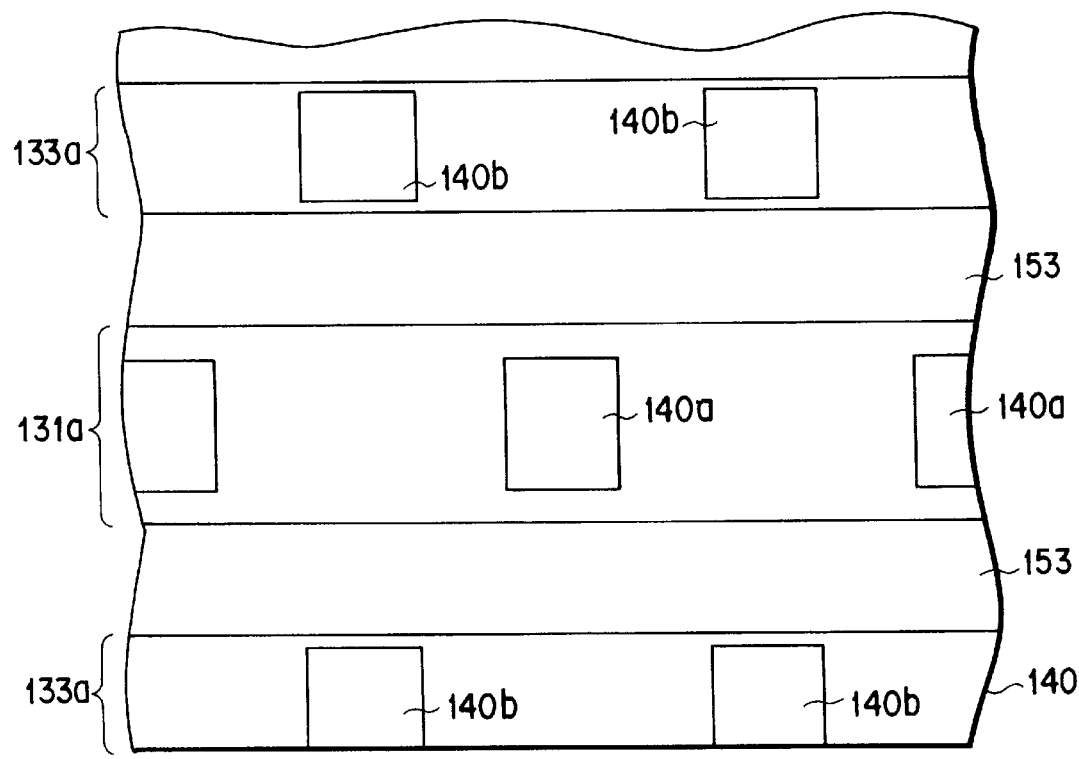
FIG. 23A is a plan view illustrating the memory cell group to explain a method for manufacturing the same.
Figure 23B:
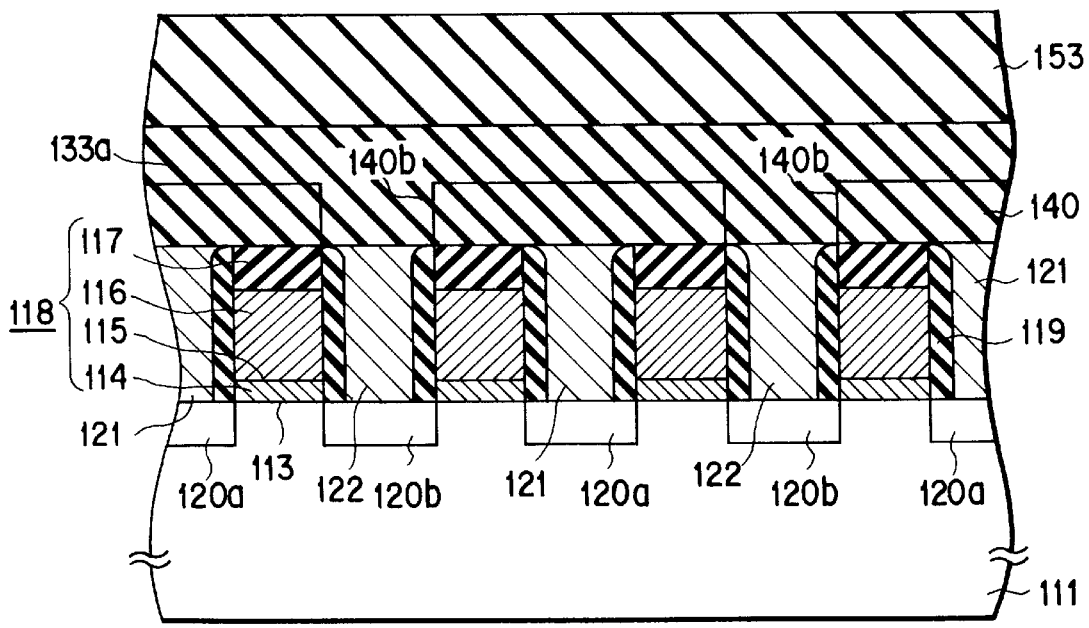
FIG. 23B is a front view illustrating the same memory cell group as shown in FIG. 23A.

Subsequently, as illustrated in FIGS. 23A and 23B, the resist pattern 152 is removed and then another resist pattern 153 is formed to form source lines 131 and bit lines 133. Using the resist pattern 153 as a mask, part of the interlayer insulation film 140 is etched by RIE. Thus, a trench 131a for the first wiring layer, which communicates with the contact hole 140a, and another trench 133a for the first wiring layer, which communicates with the contact hole 140b, are formed.

Figure 24:
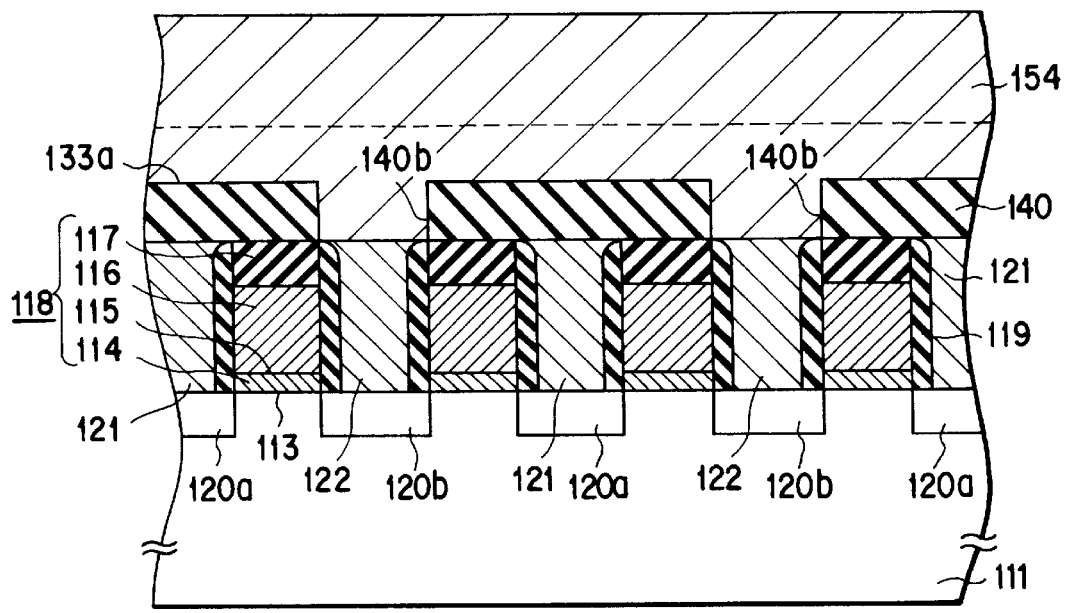
FIG. 24 is a front view illustrating the memory cell group to explain a method for manufacturing the same.

As shown in FIG. 24, after the resist pattern 153 is removed, a tungsten film 154 is deposited on the entire surface of the resultant structure using CVD or the like to completely fill the contact holes 140a and 140b and the trenches 131a and 133a.

Figure 16:
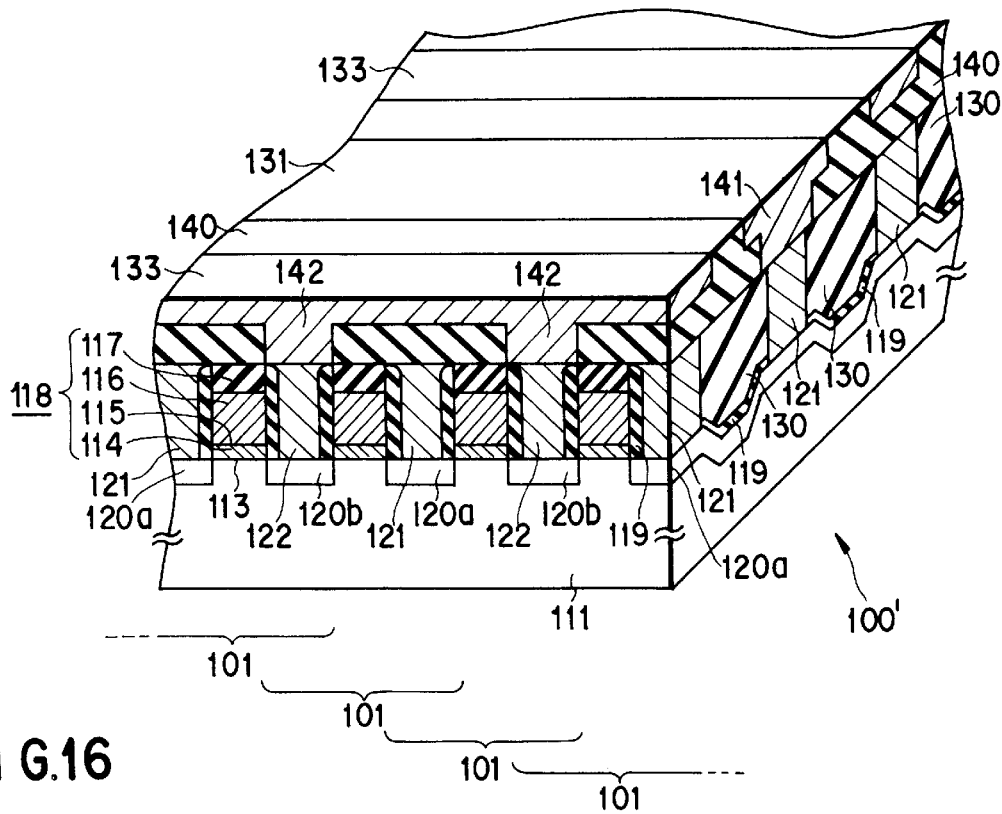
FIG. 16 is a perspective view illustrating the structure of a memory cell group of a NOR type flash EEPROM according to a second embodiment of the present invention.

The surface of the tungsten film 154 is then etched and flattened by the processing technique such as CMP until the interlayer insulation film 140 is exposed. Thus, as shown in FIG. 16, the source line 131 and the source line contact 141 for connecting the source line 131 to the contact section 121 are formed integrally with each other as a damascene structure. Similarly, the bit line 133 and the bit line contact 142 for connecting the bit line 133 to the contact section 122 are formed integrally with each other as a damascene structure, resulting in a memory cell group 100'.

After that, the passivation process is executed to complete the NOR type flash EEPROM with the memory cell group 100' having the above structure.

Even in the NOR type flash EEPROM according to the second embodiment, if a striped resist pattern is used in the PEP of contacts, the PEP margin can be increased more greatly than that required when the prior art opening type pattern for opening only the contact portions in a self-alignment fashion (see FIGS. 1A and 1B) is used, as in the first embodiment. Since, moreover, the aspect ratio can be decreased, the contact holes 130a and 130b can sufficiently be made, keeping the selective ratio of the interlayer insulation film 130 to the SiN film 119 high, thereby reliably preventing the problems of forming no contact holes and causing a short circuit between the gate and contact from arising.

In both the first and second embodiments described above, the present invention is applied to a NOR type flash EEPROM. However, it can be applied to a NAND type flash EEPROM.

(Third Embodiment)

Figure 25:
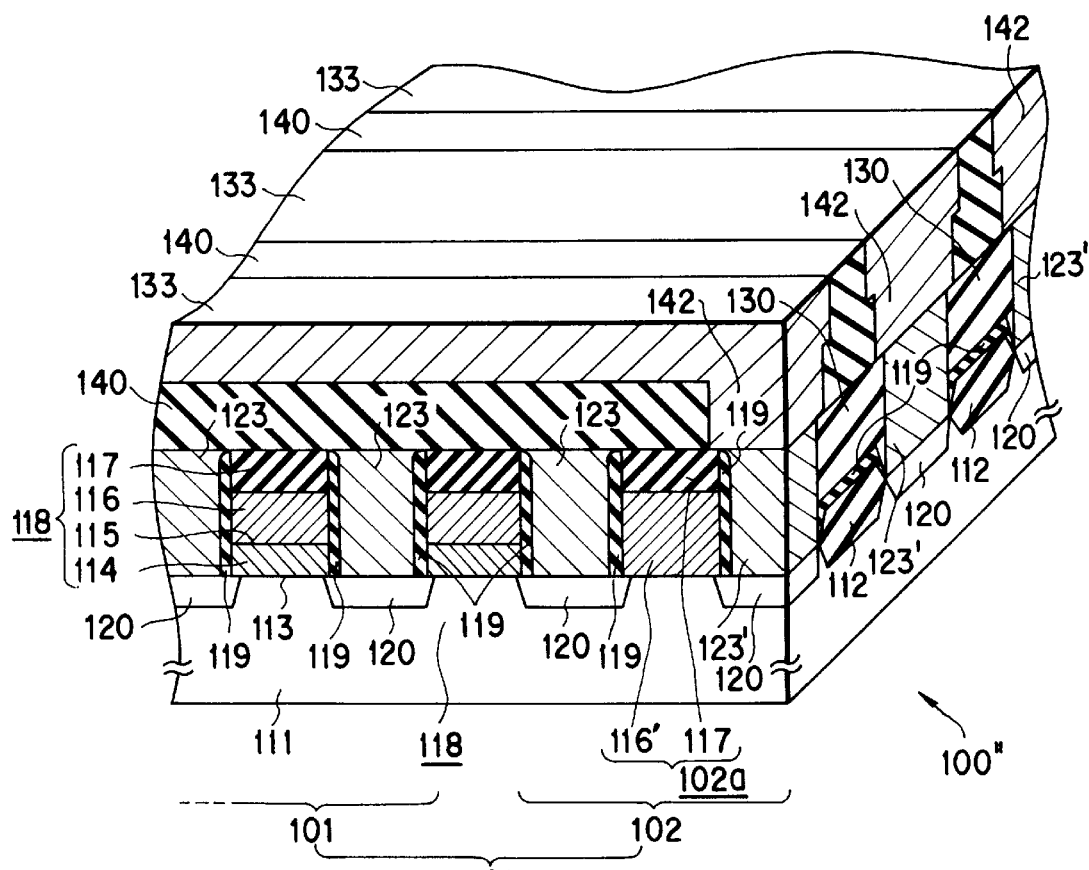
FIG. 25 is a perspective view illustrating the structure of a memory cell group of a NAND type flash EEPROM according to a third embodiment of the present invention.
Figure 26:
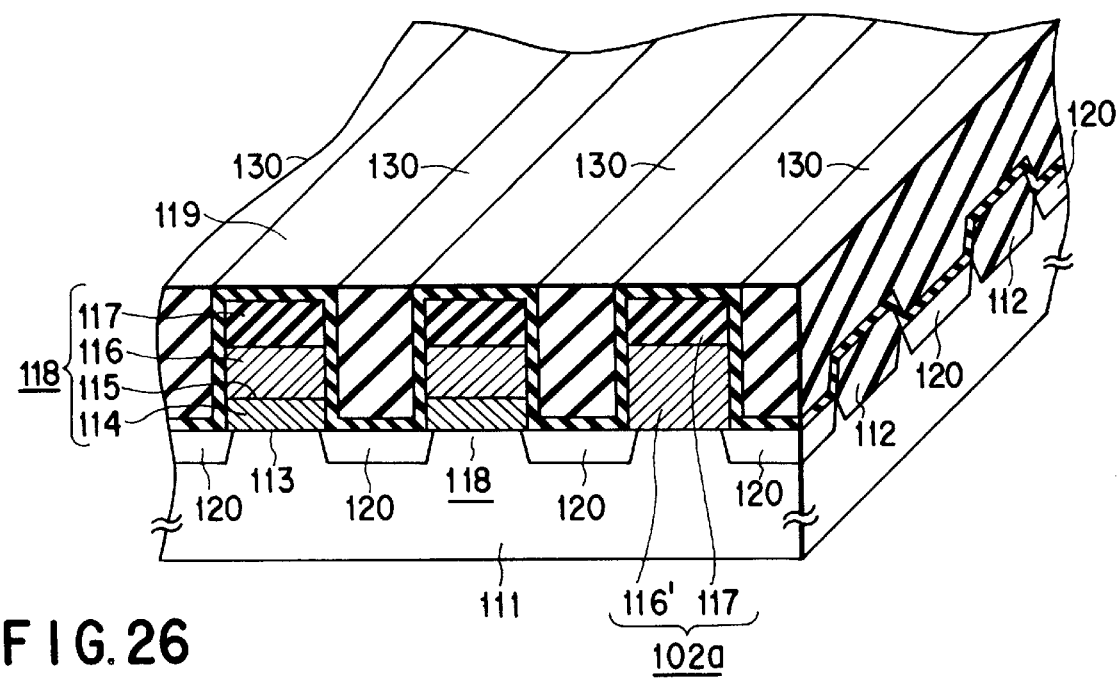
FIG. 26 is a perspective view illustrating the memory cell group to explain a method for manufacturing the same.

FIGS. 25 to 30 illustrate a nonvolatile semiconductor memory according to a third embodiment of the present invention, and a method for manufacturing a memory cell group of a NAND type flash EEPROM as the nonvolatile semiconductor memory in which a contact is subjected to the PEP using a striped resist pattern. First, as illustrated in FIG. 26, an element isolating field oxide film 112 is formed on the major surface area of a P-type semiconductor substrate 111. After that, a gate insulation film 113 is formed on the substrate 111, and both a select gate 102a of a select transistor 102 and a two-layered gate section 118 of a cell transistor 101 are formed on the film 113. The select gate 102a, which is formed at an end portion of the transistor 102, includes a gate electrode 116' and an SiN film 117 for a cap, while the two-layered gate section 118 includes a floating gate electrode 114, an ONO film 115, a control gate electrode 116, and an SiN film 117 for a cap. N-type impurities are ion-implanted to form diffusion layers 120 serving as source and drain regions on the surface area of the P-type semiconductor substrate 111 except where the field oxide film 112 is to be formed.

Subsequently, an insulation film is deposited on the entire surface of the resultant structure to form an SiN film 119 and then an interlayer insulation film (second insulation film) 130 is deposited thereon. The surface of the interlayer insulation film 130 is flattened by the processing technique such as CMP, using the SiN film 119 on the two-layered gate section 118 as a stopper.

Figure 27:
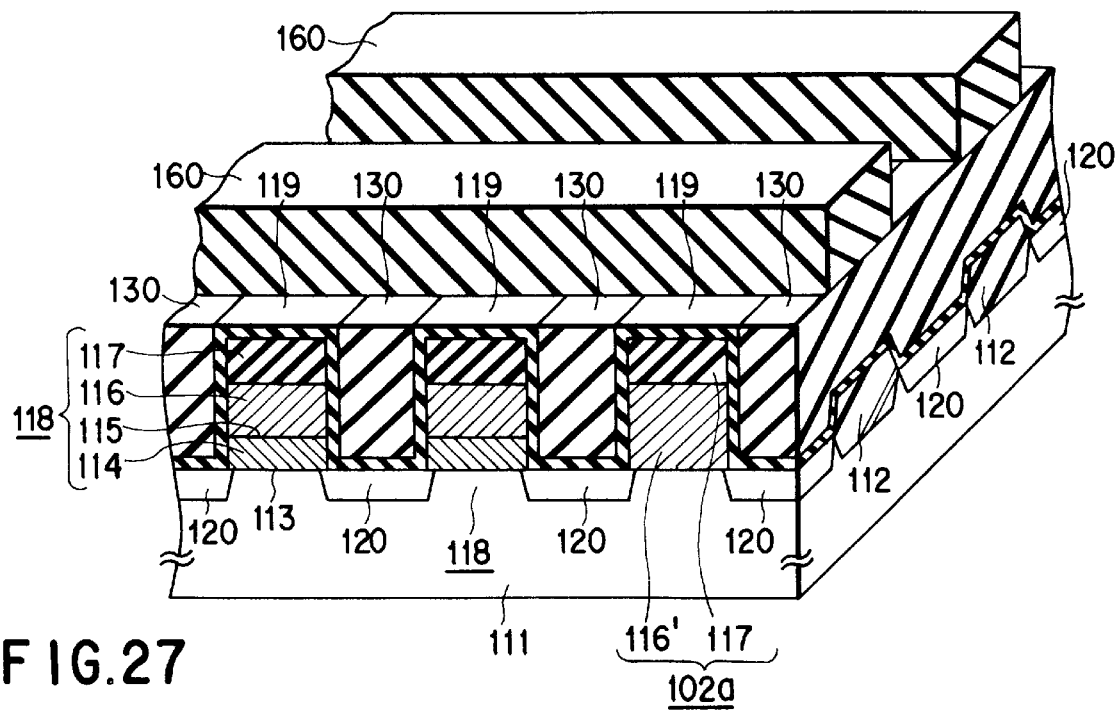
FIG. 27 is a perspective view illustrating the memory cell group to explain a method for manufacturing the same.

Referring to FIG. 27, a striped resist pattern 160 is formed by PEP and, using it as a mask, the interlayer insulation film 130 is etched by RIE. Thus, contact holes 130', which communicate with the diffusion layers 120 of the cell and select transistors 101 and 102 arranged in the column direction, are formed partly.

Figure 28:
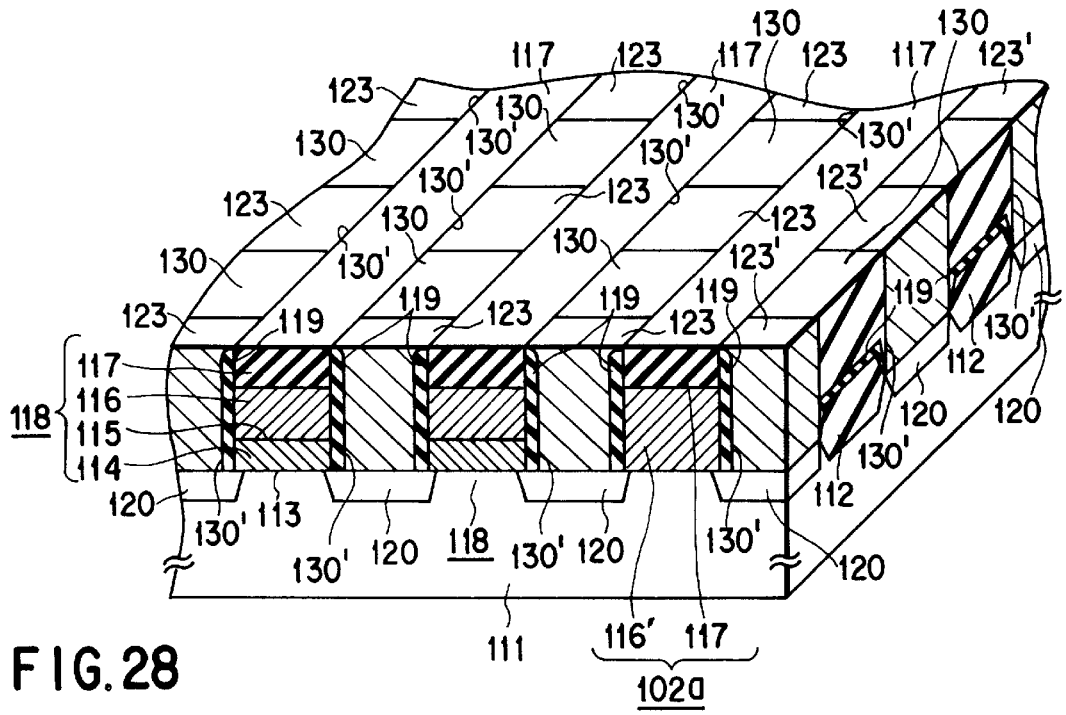
FIG. 28 is a perspective view illustrating the memory cell group to explain a method for manufacturing the same.

After the PEP of contacts is completed, as shown in FIG. 28, the resist pattern 160 used for making the contact holes 130', is eliminated and then the SiN film 119, which is exposed from the bottoms of the contact holes 130' and the surfaces of the gates 102a and 118, is etched by anisotropic etching such as RIE, with the result that a sidewall of the SiN film 119 is formed on each side of the gates 102a and 118. Thus, part of the surface of the remaining interlayer insulation film 130 is removed, and the contact holes 130', which communicate with the diffusion layers 120, are completely made.

A tungsten film (conductive material) is deposited on the entire surface of the resultant structure by CVD or the like.

Using the SiN film 117, formed on the two-layered gate sections 118, as a stopper, the tungsten film is etched by the processing technique such as CMP until the interlayer insulation film 130 is exposed, and the surface of the tungsten film is flattened. Thus, the contact holes 130' are filled with the tungsten film to form both contact portions 123 communicating with the diffusion layers 120 of the cell transistors 101 arranged in the row direction and contact portions 123' communicating with the diffusion layers 120 of the cell transistor 101. In this case, the contact portions 123 and 123' are arranged in matrix in each of the cell transistors arranged in the column and row directions.

Figure 29:
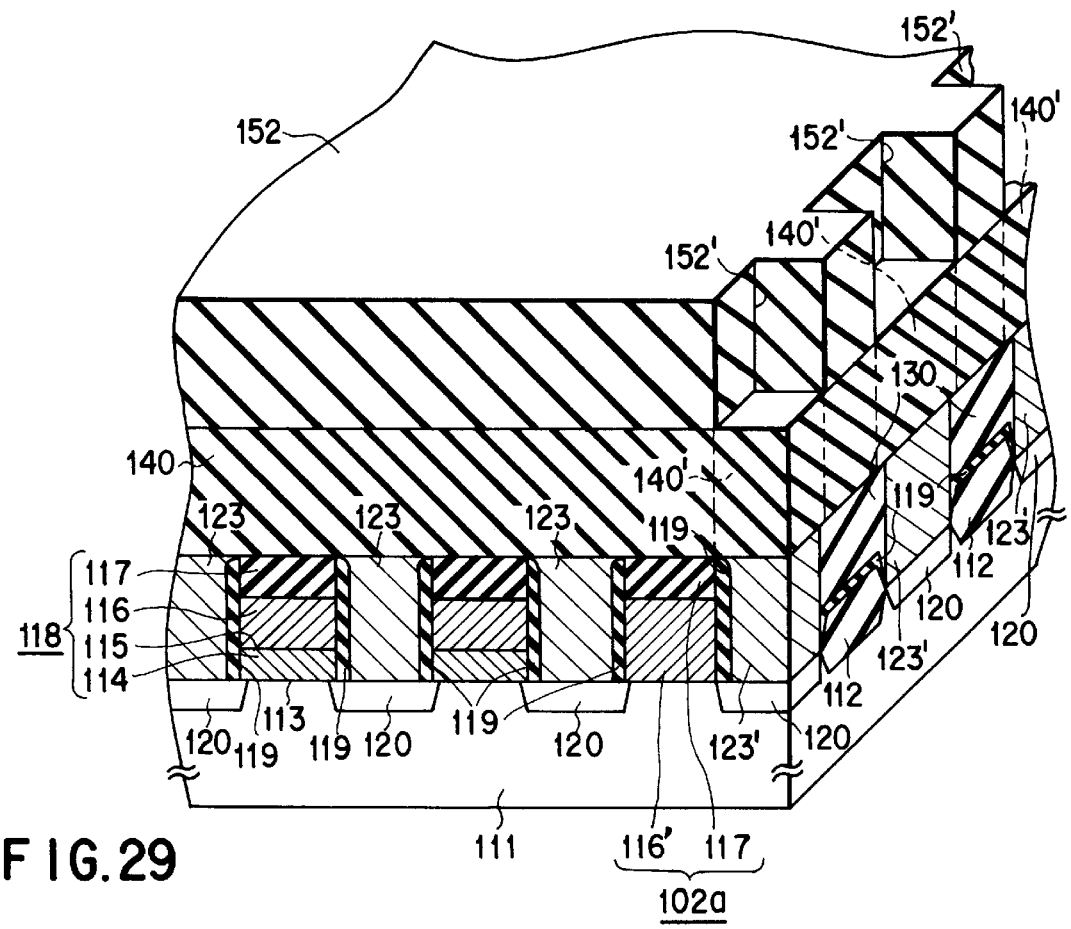
FIG. 29 is a perspective view illustrating the memory cell group to explain a method for manufacturing the same.

After that, as shown in FIG. 29, an interlayer insulation film 140 is deposited on the whole surface of the resultant structure and then a resist pattern 152 is formed thereon by PEP. The resist pattern 152 has openings 152' for forming contact holes communicating with the contact portions 123'. Using the resist pattern 152 as a mask, the interlayer insulation film 140 is etched by RIE. Thus, contact holes 140' communicating with the contact portions 123' are made in order to form bit line contacts 142.

Figure 30:
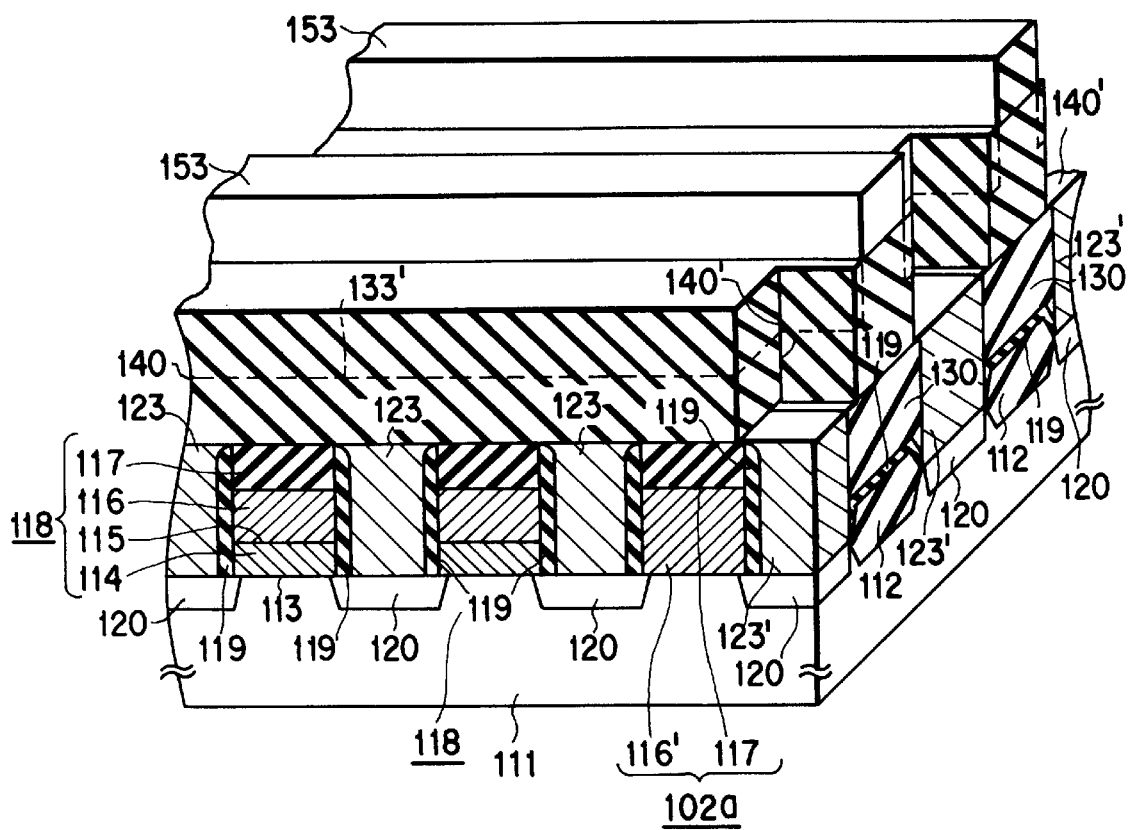
FIG. 30 is a perspective view illustrating the memory cell group to explain a method for manufacturing the same.

Subsequently, as illustrated in FIG. 30, the resist pattern 152 is removed and then another resist pattern 153 is formed to form bit lines 133. Using the resist pattern 153 as a mask, part of the interlayer insulation film 140 is etched by RIE, thereby forming a trench 133' (indicated by broken line) for the first wiring layer, which communicates with the contact holes 140'.

After the resist pattern 153 is removed, a tungsten film is deposited on the entire surface of the resultant structure using CVD or the like to completely fill the contact hole 140' and the trench 133'.

The surface of the tungsten film is then etched and flattened by the processing technique such as CMP until the interlayer insulation film 140 is exposed. Thus, as shown in FIG. 25, the bit line 133 and the bit line contact 142 for connecting the bit line 133 to the contact section 123' are formed integrally with each other as a damascene structure, resulting in a memory cell group 100''.

After that, the passivation process is executed to complete the NAND type flash EEPROM with the memory cell group 100'' having the above structure.

Even in the NAND type flash EEPROM according to the third embodiment, if a striped resist pattern is used in the PEP of contacts, the PEP margin can be increased more greatly than that required when the prior art opening type pattern for opening only the contact portions in a self-alignment fashion (see FIGS. 1A and 1B) is used, as in the first and second embodiments. Since, moreover, the aspect ratio can be decreased, the contact hole 130' can sufficiently be made, keeping the selective ratio of the interlayer insulation film 130 to the SiN film 119 high, thereby reliably preventing the problems of forming no contact holes and causing a short circuit between the gate and contact from arising.

In both the first to third embodiments described above, the P-type semiconductor substrate is employed. However, for example, an N-type semiconductor substrate can be used and, in this case, a diffusion layer of P-type impurities can be formed in the surface area of the N-type semiconductor substrate.

It is needless to say that various changes and modification can be made without departing from the scope of the subject matter of the present invention.

As described above in detail, according to the present invention, an island-like resist pattern or a striped resist pattern is used to execute the PEP of contacts. Thus, the PEP margin can be increased and the aspect ratio can be decreased when the contact holes are made. Consequently, there can be provided a nonvolatile semiconductor memory which prevents the problems of forming no contact holes and causing a short circuit between the gate and contact from arising and thus easily maintains high reliability, and a method for manufacturing the same.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a nonvolatile semiconductor memory comprising:
   a first step of forming at least two gate electrodes above a semiconductor substrate of a first conductivity type so as to be arranged at predetermined intervals substantially in parallel with each other;
   a second step of diffusing impurities of a second conductivity type to form a first semiconductor region in a surface area of said semiconductor substrate between said gate electrodes and a second semiconductor region in the surface area of said semiconductor substrate such that each of said gate electrodes is interposed between said first and second semiconductor regions;
   a third step of forming a first insulation film on an entire surface of a resultant structure;
   a fourth step of depositing a second insulation film whose etching rate differs from that of said first insulation film;
   a fifth step of flattening a surface of said second insulation film using said first insulation film as a stopper;
   a sixth step of forming a resist pattern having a predetermined shape on said second insulation film to selectively remove said second insulation film located above said first semiconductor region and said second semiconductor region;
   a seventh step of removing said first insulation film remaining on said first and second semiconductor regions to expose surfaces of said first and second semiconductor regions and then depositing a conductive material on an entire surface of a resultant structure; and
   an eighth step of flattening a surface of the conductive material so as to be substantially flush with an upper surface of each of said gate electrodes to form conductive plugs communicating with said first and second semiconductor regions.

2. The method according to claim 1, wherein in said sixth step, said resist pattern is arranged like an island on said second insulation film between said at least two gate electrodes, said second insulation film between said at least two gate electrodes, which is located above said first semiconductor region, is selectively removed, and said second insulation film between said at least two gate electrodes, which is located above said second semiconductor region, is continuously removed.

3. The method according to claim 1, wherein in said eighth step, the surface of said conductive material is flattened using a nitride film serving as a cap material of said gate electrodes, as a stopper.

4. The method according to claim 1, wherein said first and second semiconductor regions are each divided into a plurality of semiconductor regions by element isolation regions arranged in a direction substantially perpendicular to said gate electrodes.

5. The method according to claim 1, further comprising:
   a ninth step of connecting at least part of said conductive plugs, which communicates with said first semiconductor region, to a bit line; and
   a tenth step of connecting at least part of said conductive plugs, which communicates with said second semiconductor region, to a source line.

6. The method according to claim 1, wherein said at least two gate electrodes have a stacked structure in which an inter-gate insulation film is formed on a floating gate electrode and a control gate electrode is formed on the inter-gate insulation film.

7. A method for manufacturing a nonvolatile semiconductor memory comprising:
   a first step of selectively forming element isolation regions on a main surface area of a semiconductor substrate having a first conductivity type;
   a second step of forming at least two gate electrodes above said semiconductor substrate in a direction substantially perpendicular to said element isolation regions so as to be arranged at predetermined intervals substantially in parallel with each other;
   a third step of alternately removing said element isolation regions formed between said at least two gate electrodes;
   a fourth step of diffusing impurities of a second conductivity type to selectively form a first semiconductor region in a surface area of said semiconductor substrate between said at least two gate electrodes and continuously form a second semiconductor region in the surface area of said semiconductor substrate such that each of said at least two gate electrodes is interposed between said first and second semiconductor regions;
   a fifth step of forming a first insulation film on an entire surface of a resultant structure;
   a sixth step of depositing a second insulation film whose etching rate differs from that of said first insulation film;
   a seventh step of flattening a surface of said second insulation film using said first insulation film as a stopper;
   an eighth step of forming a resist pattern having a predetermined shape on said second insulation film to selectively remove said second insulation film located above said first semiconductor region and said second semiconductor region;
   a ninth step of removing said first insulation film remaining on said first and second semiconductor regions to expose surfaces of said first and second semiconductor regions and then depositing a conductive material on an entire surface of a resultant structure; and
   a tenth step of flattening a surface of the conductive material so as to be substantially flush with an upper surface of each of said at least two gate electrodes to form conductive plugs communicating with said first and second semiconductor regions.

8. The method according to claim 7, wherein in said eighth step, said resist pattern is formed like a stripe in a direction substantially perpendicular to said at least two gate electrodes, and said second insulation film is removed in matrix.

9. The method according to claim 3, wherein in said tenth step, the surface of said conductive material is flattened using a nitride film serving as a cap material of said gate electrodes, as a stopper.

10. The method according to claim 7, further comprising:
a ninth step of connecting at least part of said conductive plugs, which communicates with said first semiconductor region, to a bit line; and
a tenth step of connecting at least part of said conductive plugs, which communicates with said second semiconductor region, to a source line.

11. The method according to claim 7, wherein said at least two gate electrodes have a stacked structure in which an inter-gate insulation film is formed on a floating gate electrode and a control gate electrode is formed on the inter-gate insulation film.

12. A method for manufacturing a nonvolatile semiconductor memory comprising:
a first step of selectively forming element isolation regions on a main surface area of a semiconductor substrate having a first conductivity type;
second step of forming a plurality of gate electrodes above said semiconductor substrate in a direction substantially perpendicular to said element isolation regions so as to be arranged at predetermined intervals substantially in parallel with each other;
a third step of diffusing impurities of a second conductivity type to form semiconductor regions in a surface area of said semiconductor substrate at one side of each of said gate electrodes and at another side thereof;
a fourth step of forming a first insulation film on an entire surface of a resultant structure;
a fifth step of depositing a second insulation film whose etching rate differs from that of said first insulation film;

a sixth step of flattening a surface of said second insulation film using said first insulation film as a stopper;
a seventh step of forming a resist pattern like a stripe in a direction substantially perpendicular to said at least two gate electrodes and selectively removing said second insulation film above said semiconductor regions;
an eighth step of removing said first insulation film remaining on said semiconductor regions to expose surfaces of said semiconductor regions and then depositing a conductive material on an entire surface of a resultant structure; and
a ninth step of flattening a surface of the conductive material so as to be substantially flush with an upper surface of each of said at least two gate electrodes to form conductive plugs communicating with said semiconductor regions.

13. The method according to claim 12, wherein at least part of said at least two gate electrodes has a stacked structure in which an inter-gate insulation film is formed on a floating gate electrode and a control gate electrode is formed on the inter-gate insulation film.

14. The method according to claim 12, wherein in said ninth step, the surface of said conductive material is flattened using a nitride film serving as a cap material of said gate electrodes, as a stopper.

15. The method according to claim 12, further comprising a step of connecting part of said conductive plugs to a bit line.

* * * * *